(12) United States Patent
Shimizu et al.

(10) Patent No.: US 7,763,934 B2
(45) Date of Patent: Jul. 27, 2010

(54) NONVOLATILE SEMICONDUCTOR MEMORY AND METHOD OF MANUFACTURING THE SAME

(75) Inventors: Tatsuo Shimizu, Tokyo (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 79 days.

(21) Appl. No.: 12/051,274

(22) Filed: Mar. 19, 2008

(65) Prior Publication Data
US 2008/0237697 A1 Oct. 2, 2008

(30) Foreign Application Priority Data
Mar. 28, 2007 (JP) .............................. 2007-084275

(51) Int. Cl.
*H01L 27/108* (2006.01)
(52) U.S. Cl. .................. 257/321; 257/314; 257/315; 257/E29.309
(58) Field of Classification Search ............... 257/314, 257/315, 321, E29.309
See application file for complete search history.

(56) References Cited
U.S. PATENT DOCUMENTS
2005/0258467 A1* 11/2005 Wang et al. ................. 257/314

2005/0281086 A1* 12/2005 Kobayashi et al. ..... 365/185.23

FOREIGN PATENT DOCUMENTS
JP 2004-336044 11/2004
JP 2008-91929 4/2008

OTHER PUBLICATIONS
U.S. Appl. No. 12/050,427, filed Mar. 18, 2008, Tatsuo Shimizu, et al.
U.S. Appl. No. 11/854,090, filed Sep. 12, 2007, Tatsuo Shimizu, et al.
U.S. Appl. No. 12/189,400, filed Aug. 11, 2008, Shimizu, et al.

* cited by examiner

*Primary Examiner*—Tan N Tran
(74) *Attorney, Agent, or Firm*—Oblon, Spivak, McClelland, Maier & Neustadt, L.L.P.

(57) ABSTRACT

A metal oxide having a sufficiently higher dielectric constant than silicon nitride, such as Ti oxide, Zr oxide, or Hf oxide is used as base material, and in order to generate a trap level capable of moving in and out electrons therein, a high-valence substance of valence of 2 or more (that is, valence VI or higher) is added by a proper amount, and to control the trap level, a proper amount of nitrogen (carbon, boron, or low-valence substance) is added, and thus a nonvolatile semiconductor memory having a charge accumulating layer is obtained.

20 Claims, 11 Drawing Sheets

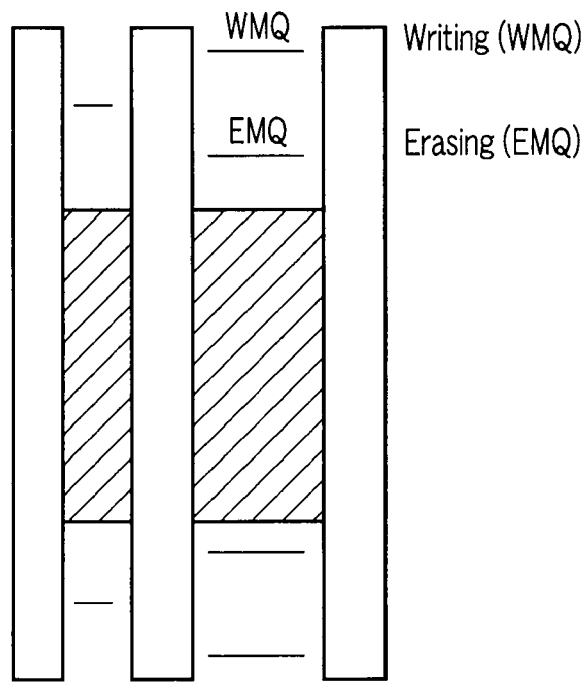
F I G. 11
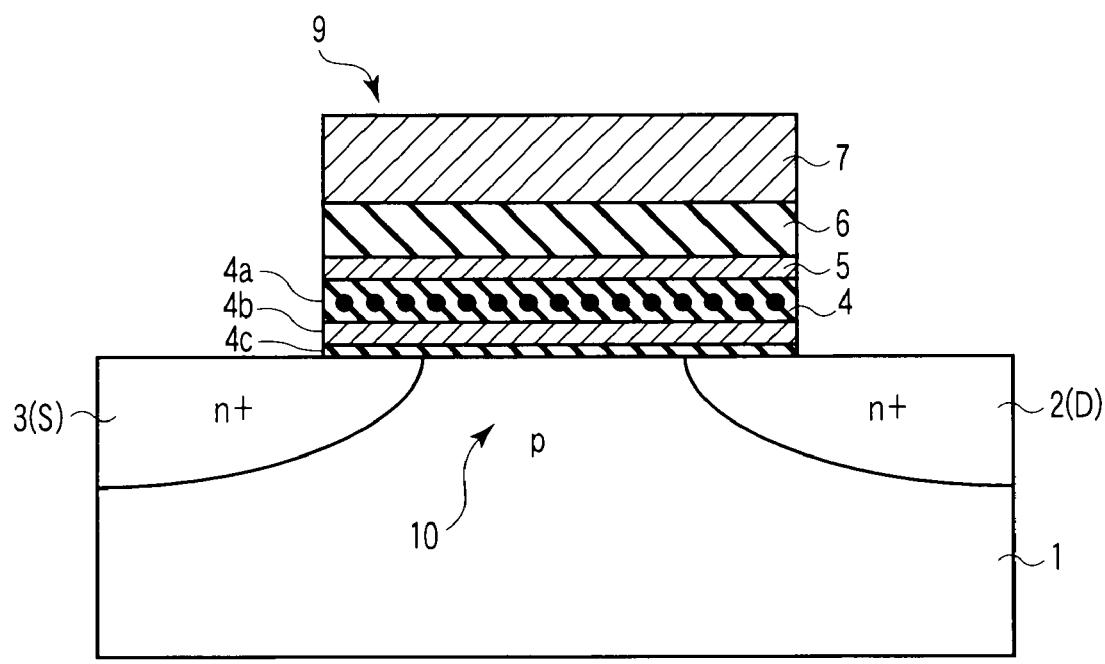
F I G. 12

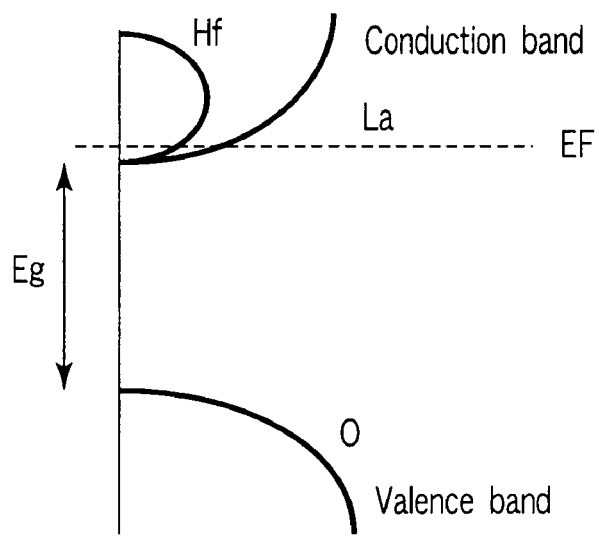
F I G. 19
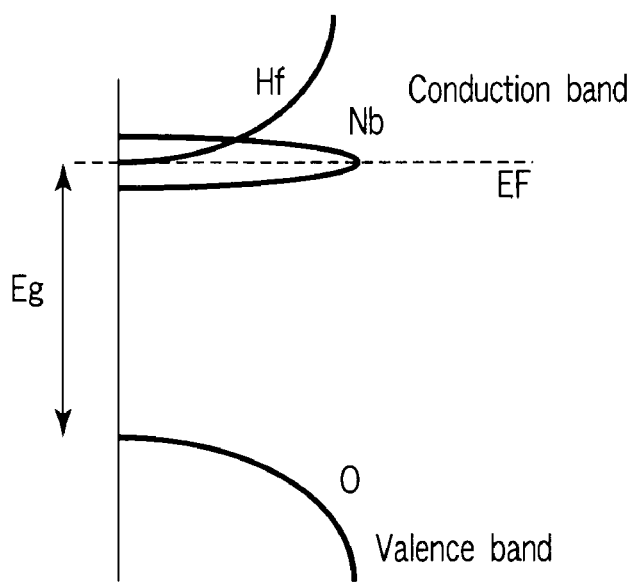
F I G. 20

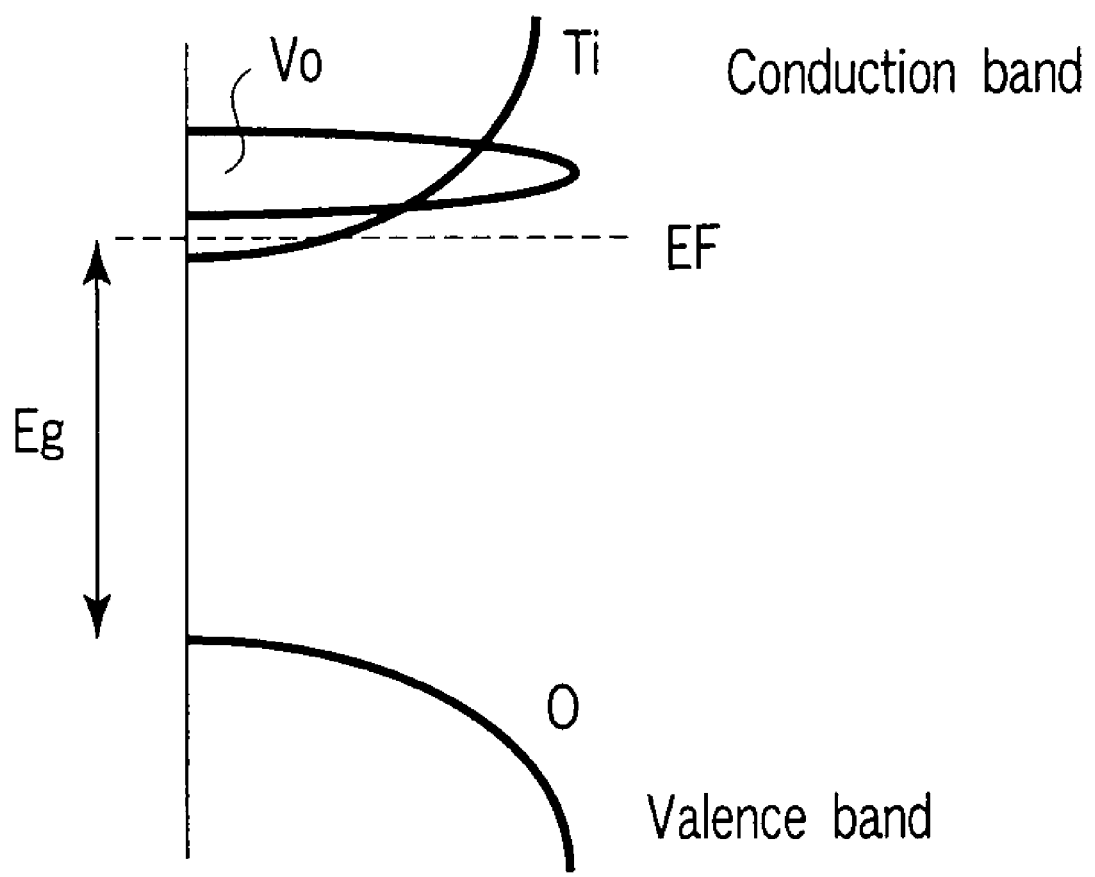
F I G. 21

NONVOLATILE SEMICONDUCTOR MEMORY AND METHOD OF MANUFACTURING THE SAME

CROSS-REFERENCE TO RELATED APPLICATIONS

This application is based upon and claims the benefit of priority from prior Japanese Patent Application No. 2007-084275, filed Mar. 28, 2007, the entire contents of which are incorporated herein by reference.

BACKGROUND OF THE INVENTION

1. Field of the Invention

The present invention relates to a nonvolatile semiconductor memory having an electric charge accumulating insulating film made of a high dielectric material, and a method of manufacturing the same.

2. Description of the Related Art

Generally, a flash memory is known as one of nonvolatile semiconductor memories, and it is widely used in electronic appliances. This flash memory does not require any electric holding action for storage (holding power supply), and programs can be easily written therein after the product is completed.

A further finer structure and operation at a lower voltage are demanded in next-generation and future NAND flash memories. For the NAND flash memory, a flat-cell structure is needed because of difficulty in burying IPD (inter-poly dielectrics) in cells in the manufacturing process. To realize the flat-cell structure, in addition to assurance of charge amount by compensating for decrease in contact area of IPD and FG (floating gate), it is essential to reduce the thickness of IPD, FG and a tunnel film in order to suppress interference between cells and lower the voltage. In the FG structure, to maintain the nonvolatility, the tunnel film must be thicker than specified, which is contradictory to realization of the fine structure. This is because, in the case of the FG structure for accumulating an electric charge in a metal gate film, if a local defect occurs in the tunnel film, the majority of the accumulated charge is lost through the defect. One of the methods for solving the problem is to use a memory cell structure having a discrete type charge accumulating layer instead of the FG structure. One of the candidates therefore is MONOS (metal-oxide-nitride-oxide semiconductor).

The structure of a memory cell containing the charge accumulating layer by conventional MONOS is composed of, for example, a multi-layer structure of a tunnel layer of an insulating film (oxide film), a trap layer of a silicon nitride film, a block layer of an insulating film, and a metal gate electrode formed on a channel region of a silicon substrate formed with a source and a drain.

This MONOS is formed by accumulating an electric charge on silicon nitride (SiN). In the technologies disclosed so far, at practical level, the charge accumulating amount of silicon nitride is not enough, and the threshold voltage change width is not sufficient. If the silicon amount is increased in order to increase the charge accumulating amount, for example, the state become metallic, and the same problem as in the conventional FG structure occurs.

Further, when silicon nitride is used in the charge accumulating layer, a sufficient driving voltage must be applied to the tunnel film, and low-voltage operation is not expected. This is because the dielectric constant of silicon nitride is low. Besides, when erasing data, the technology using sufficient threshold change width by drawing out electrons excessively cannot be applied to the charge accumulating layer of silicon nitride. This is mainly because a great energy is needed for drawing out electrons further after reaching a state free of writing by electrons. Furthermore, since the dielectric constant of a silicon nitride film is low, the charge capturing section area is smaller. As a result, the charge capturing efficiency is poor, and the threshold controllability is low.

It has been also attempted to fabricate a charge accumulating film by exposing $TiO_2$, instead of silicon nitride, to plasma damage. In this case, since lots of oxygen defects occur, an electric charge is accumulated, but oxygen defects in ionic oxide generally have a property to generate a state near the conduction band bottom. Accordingly, when a charge accumulating layer is formed by damaging ionic oxide such as $TiO_2$ or $HfO_2$, the accumulating layer behaves like an n-type semiconductor, and the charge may be lost by local defect of the tunnel film. That is, a charge accumulating layer making use of oxygen defects such as $TiO_2$ may have an imperfect structure, in principle, in terms of holding of electric charge. To solve this problem, a nonvolatile semiconductor memory device is proposed, for example, as disclosed in JP-A 2004-336044 (KOKAI).

This publication, JP-A 2004-336044 (KOKAI) discloses a technology of introducing Lantanoide elements into $HfO_2$, $ZrO_2$, $TiO_2$, as the charge accumulating layer. For example, in addition of La (exactly the same in other Lantanoide substances), La is a trivalent substance additive, and a substance of valence of +3 is introduced instead of valence of +4, and oxygen is deficient and is stabilized in order to compensate for electric charge. This oxygen defects behaves like n-type and much charge cannot be collected, and it is difficult to realize high density charge trapping by introduction of La.

BRIEF SUMMARY OF THE INVENTION

An embodiment of the invention provides a nonvolatile semiconductor memory capable of enhancing the electric accumulating amount and increasing the threshold variation width outstandingly, and further writing, reading, and erasing at high speed and low voltage, by adding most of the applied voltage between the gate and channel to the tunnel film.

One embodiment provided a nonvolatile semiconductor memory comprising: a semiconductor substrate having a source region and a drain region, and also a channel region provided between the source region and the drain region; a first insulating layer formed on the channel region; a charge accumulating layer formed on the first insulating layer and having an oxide dielectric film including one of Ti, Zr and Hf and the oxide dielectric film containing an element a selected from a first group consisting of Tc, Re, Ru, Os, Rh, Ir, Pd, Pt, Co, Ni, W, Mo, Cr, Mn and Fe, and an element β selected from a second group consisting of nitrogen, carbon, boron, Mg, Ca, Sr, Ba, Al, Sc, Y, La and Lantanoide; a second insulating layer formed on the charge accumulating layer; and a control gate electrode formed on the second insulating layer.

A further embodiment provides a method of manufacturing a nonvolatile semiconductor memory comprising: forming a source region and a drain region across an interval on a semiconductor substrate, and forming a channel region in the interval; forming a first insulating layer on the channel region; forming a charge accumulating layer on the first insulating layer, the charge accumulating layer having an oxide dielectric film of Ti, Zr or Hf, the oxide dielectric film containing an element α selected from a first group consisting of Tc, Re, Ru, Os, Rh, Ir, Pd, Pt, Co, Ni, W, Mo, Cr, Mn and Fe, and an element β selected from a second group consisting of nitrogen, carbon, boron, Mg, Ca, Sr, Ba, Al, Sc, Y, La and Lantanoide; forming a second insulating layer on the charge accumulating layer; and forming a control gate electrode on the second insulating layer.

BRIEF DESCRIPTION OF THE SEVERAL VIEWS OF THE DRAWING

FIG. 11 is an explanatory diagram of potential of double quantum well;

FIG. 12 is a diagram of a memory structure provided with a tunnel film of a double quantum well structure;

FIG. 19 is a band structure diagram of comparative example 1;

FIG. 20 is a band structure diagram of comparative example 2; and

FIG. 21 is a band structure diagram of comparative example 3.

DETAILED DESCRIPTION OF THE INVENTION

Figure 1:
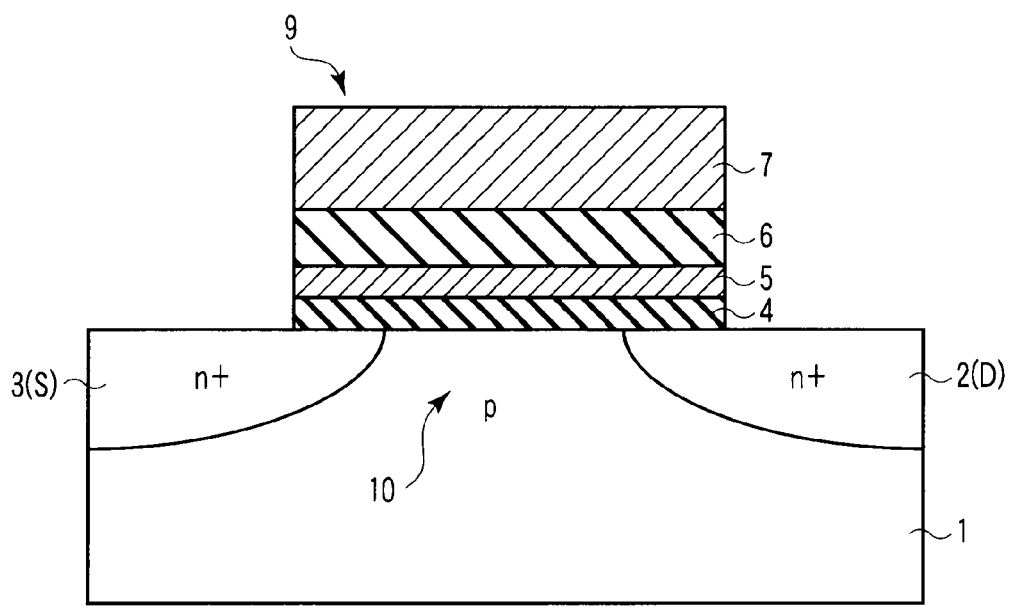
FIG. 1 is a sectional view of principal parts of a memory cell according to a first embodiment.

Referring now to the drawings, a preferred embodiment of the invention will be specifically described below.

First, the concept of a nonvolatile semiconductor memory (charge accumulating type memory) according to the embodiment will be explained.

In FIG. 1, on a layer or substrate made of silicon, for example, on an upper surface of a silicon semiconductor substrate (silicon substrate) 1, a source region (S) 3, and a drain region (D) 2 are formed across an interval (or distance: channel length). This interval is an appropriate distance determined on the basis of design specification of the memory, and is formed as a channel region 10. The channel region 10 is a current passage for propagating data.

On this channel region 10, a gate 9 of a multi-layer structure is provided for controlling the memory action (writing, reading, and easing). The gate 9 has a multi-layer structure having a first insulating layer (tunnel layer) 4, a charge accumulating layer 5, a second insulating layer (block layer) 6, and a control gate electrode (writing, reading and erasing control electrode) 7 sequentially multi-layer in this order from just above the silicon substrate 1.

The charge accumulating layer 5 is mainly made of a material sufficiently higher in dielectric constant than a silicon nitride film, and contains proper amounts of high-valence substance and nitrogen in order to generate a trap level capable of moving electrons in and out. Instead of nitrogen, it is also effective to add carbon, boron, or low-valence substance.

Referring now to FIG. 1, the concept of a charge accumulating type memory will be explained.

In the charge accumulating type memory, the following findings were obtained by adding a high-valence substance to Ti oxide, Zr oxide, Hf oxide or other metal oxide having a sufficiently higher dielectric constant than silicon nitride. A method of manufacturing a high dielectric film composed of these metal oxides includes any existing representative film forming method, such as CVD (chemical vapor deposition) method, ALD (atomic layer deposition) method, MBE (molecular beam epitaxy) method, sputtering method, vapor deposition method, or combined method of coating followed by laser irradiation.

Oxygen defects are generated in a high dielectric film manufactured by such methods. As a result, the dielectric film becomes an n-type semiconductor, and if there is local defect in the tunnel layer, the charge is lost. Accordingly, by introducing a proper amount (not forming band) of high-valence substance described below, a level is generated in the gap, and an action of trapping an electron or withdrawing an electron is expressed. Since a level is formed in the gap, even if there is a local defect in the tunnel layer, the charge is not lost. Further, even if an oxygen defect occurs in the charge accumulating layer, extra electrons will be dropped into the level in the gap, and the charge is not lost.

The feature of the level generated in the high dielectric film by introducing a proper amount of the high-valence substance will be explained below. The following feature was clarified by the first-principles calculation for the first time in the process of development of the charge accumulating layer.

Figure 2:
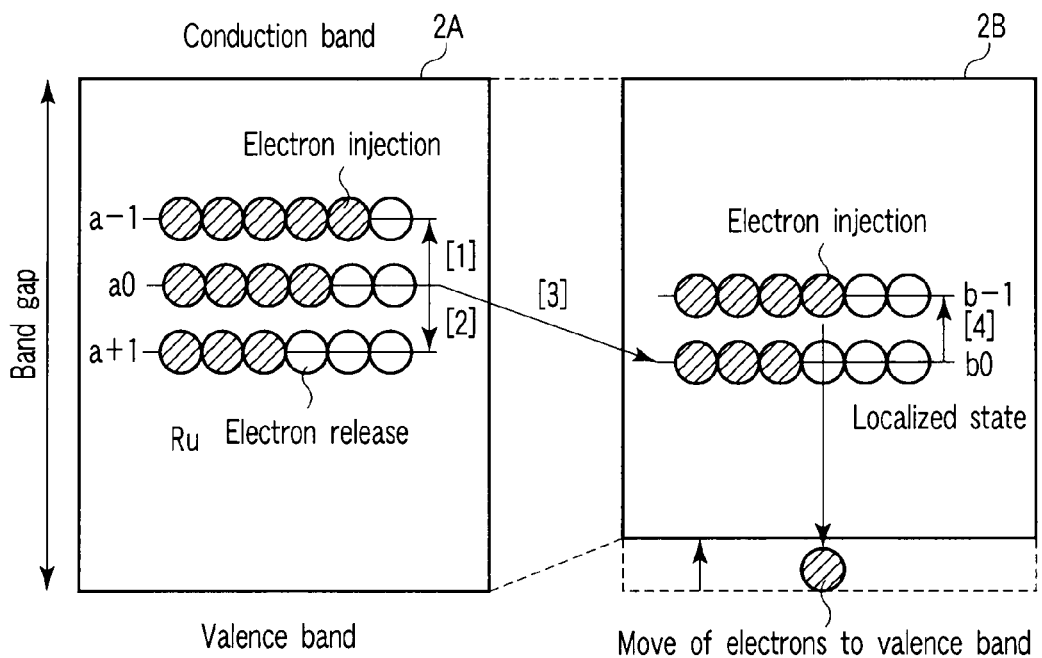
FIG. 2 is a diagram showing changes of trap level and a moving mode of electrons from the trap level.

Its feature is that the level ascends or descends depending on the number of electrons in the generated level as shown in 2A in FIG. 2 (arrow [1] and arrow [2] in 2A of FIG. 2). FIG. 2 is a diagram showing changes of trap level corresponding to the changes in the number of electrons in the trap level by introduction of high-valence substance, and a moving mode of electrons from the trap level by simultaneous introduction of nitrogen, carbon, boron, or low-valence substance.

When electrons are introduced (injected) in the level, electrons existing in the same level repulse each other, and the energy level is raised (arrow [1] in 2A of FIG. 2).

To the contrary, when the electrons are removed, mutually repulsing electrons are decreased, and hence the energy level drops (arrow [2] in 2A of FIG. 2). Such level variation width was about 0.3 eV, which is a significantly large value. That is, when electrons are accumulated in this level, as the accumulating amount increases, the level is elevated.

The first-principles calculation will be briefly described below. This is an electronic state calculation by density functional using ultra-soft pseudo-potential. The potential of each element (such as titanium or oxygen) has been already used in various forms, and is high in reliability. In this embodiment, the calculation is very high in precision. For example, the lattice constant determined by calculation involves an error of 0.6% or smaller as compared with an experimental value. Generally, in calculation of a dielectric material, the precision of lattice constant is very important, and a sufficient precision is achieved in this calculation.

When introducing a proper amount of the high-valence substance in the high dielectric film (or at the same time), nitrogen (or carbon, boron, or low-valence substance) is introduced. It is proved by the first-principles calculation that, by this introduction of nitrogen, the electronic state in the level can be controlled. That is, when nitrogen is introduced, electrons existing in the level generated by the introduction of the high-valence substance can be dropped into a valence band (composed of nitrogen and oxygen). By this dropping, the number of electrons existing in the level decreases, and thus the energy level moves to a deeper direction, as disclosed by the first-principles calculation.

This mode of decline of energy level is indicated by arrow [3] between 2A and 2B in FIG. 2. It can be seen that as one electron is dropped into the valence band, the electron repulsion decreases, thereby lowing the level.

Figure 3:
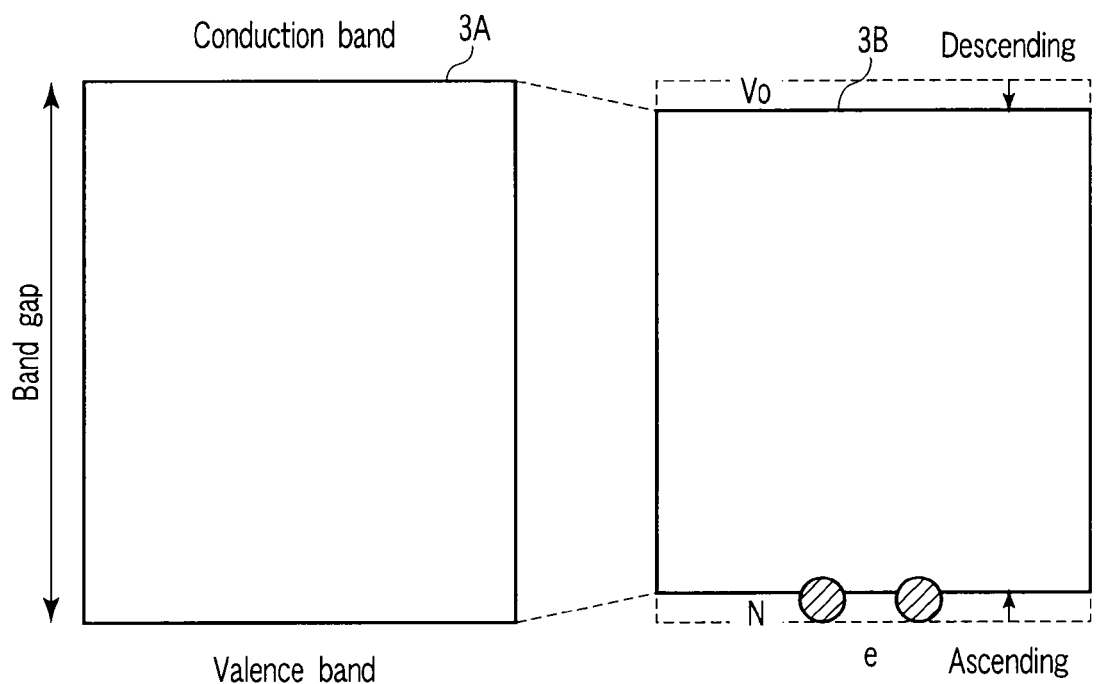
FIG. 3 is a diagram showing changes of band gap by addition of nitrogen only.

Referring to FIG. 3, difference from introduction of nitrogen only will be explained. In this example, only nitrogen N is introduced in the charge accumulating layer, such as $TiO_2$ or high dielectric film. Nitrogen is a substance becoming a valence of −3, and nitrogen of valence of −3 is introduced instead of oxygen of valence of −2. At this time, in order to compensate for charge, oxygen is deficient and is stabilized. By oxygen deficiency, as shown in 3B, the bottom of conduction band is further lowered, and the base material behaves like n-type. By this behavior, much charge cannot be accumulated, and it is difficult to realize high density of charge by introduction of nitrogen only.

So far has been explained an example of introducing nitrogen only, but the action is the same when only carbon or only boron is introduced in the oxygen position, or when a low-valence substance is introduced in the position of Ti, Zr, or Hf of base metal. That is, since oxygen defects occur, much charge cannot be accumulated, and it is difficult to realize high density of charge. In this case, electrons introduced in the conduction band are accumulated in the conduction band. Considering the charge collecting mechanism, electrons cannot be withdrawn over the number of electrons injected from outside. Hence, the threshold cannot be adjusted by withdrawing electron excessively.

As in the case of introducing only nitrogen, a film having lots of oxygen defects is not appropriate from the viewpoint of reliability. This is because, if attempted to inject charge into a film having lots of oxygen defects, layout of atoms around the oxygen defects is broken. In this case, the dielectric characteristic and insulating characteristic are extremely spoiled, and the reliability of memory action are spoiled.

Similarly, a film having lots of oxygen defects by introducing only nitrogen is not appropriate from the viewpoint of leak characteristic. This is because, in the film containing lots of oxygen defects, the oxygen defects move around freely, and the circumference of oxygen defects is easily crystallized. This crystallization is believed to take place because locally moving oxygen defects tend to move toward a most stable crystal structure. When crystals are deposited, many crystal grain boundaries are formed, and a leak pass occurs. As a result, the insulating characteristic is extremely spoiled, and thus the memory holding characteristic is lost.

The base material used in the charge accumulating layer of the embodiment will be explained.

A charge accumulating layer 5 is formed of a base material having a high dielectric constant. At this time, the voltage applied to the charge accumulating layer 5 can be decreased, and the majority of voltage can be applied to the tunnel layer 4. As a result, the memory action at a low voltage is enabled. Further, by heightening the dielectric constant of the second insulating layer (block layer) 6 used for blocking charge transfer to the control gate electrode 7, a further lower voltage is realized.

For example, when Ti oxide is used, a high dielectric constant of 30 to 1000 will be possible. When Zr oxide or Hf oxide is used, the dielectric constant is about 20 to 30. As compared with Zr oxide or Hf oxide, the Ti oxide is expected to be higher in dielectric constant by 1.5 times to 50 times approximately. Therefore, the Ti oxide is most appropriate as base material. Meanwhile, a material high in dielectric constant generally tends to be higher in ΔEc (band offset of conduction band of tunnel layer and charge accumulating layer) as shown in an example of the memory structure in FIG. 9. This aspect is also a merit of using Ti oxide as base material.

Additives will be explained.

When a substance of low valence is added to a high dielectric material such as Ti oxide, Zr oxide or Hr oxide having valence of IV, basically, a level is not generated in the gap. This is because oxygen defects occur due to heat treatment process (annealing process, etc.) in the manufacturing process, and the film structure is stabilized. It is exactly the same when nitrogen is introduced.

The oxygen defect state appears near the conduction band, and spreads widely, and thus the charge cannot be accumulated at high concentration. When V, Nb or Ta having valence one rank higher (valence V) is added, the level appears near the conduction band, and thus a structure of supplying electrons is formed, and a behavior like n-type takes place. Same as above, therefore, even in this state, the charge cannot be accumulated at high concentration. Further, when a substance having valence two ranks higher (valence VI) is added, the position of the level in the gap by addition of traces is moved to the inside of the gap, as suggested by the result of calculation.

By contrast, in the embodiment, by using at least one of Ti, Zr, and Hf as metal for composing the base oxide, a substance of high valence is substituted for Ti, Zr, or Hf. By calculation, when the additive material is any one of Tc, Re, Ru, Os, Rh, Ir, Pd, Pt, Co, Ni, W, Mo, Cr, Mn, and Fe, a level is generated in the band gap. At this time, electrons are filled in part of the level, and electrons are empty in other part thereof.

Figure 5:
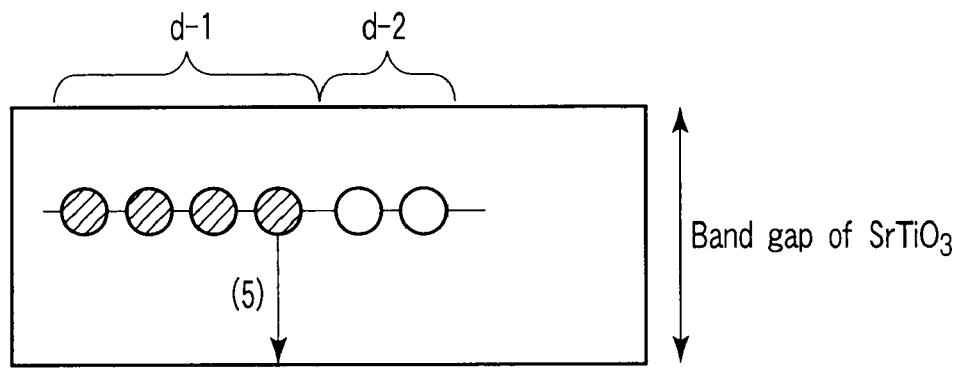
FIG. 5 is a diagram showing an electron state of $SrTiO_3$ by addition of Ru, or an electron state of $SrTiO_3$ by addition of both Ru and nitrogen.

FIG. 5 is a schematic diagram of introducing only Ru in $SrTiO_3$.

When only Ru is added, two orbits d-1 where Ru is localized are filled with electrons, and one orbit d-2 is vacant.

When electrons are injected into the vacant level from outside, a minus charge is accumulated. When existing electrons are withdrawn to outside, the plus charge is accumulated as compared with before the withdrawal. By making use of this phenomenon, a large threshold change, straddling the both plus and minus sides, is designed. Of course, depending on the mode of action, holes may be injected.

When electrons are injected, the level is elevated, and the holding characteristic tends to deteriorate. However, when nitrogen is introduced at the same time (or when carbon, boron, or low-valence substance is introduced), the vacant state increases (arrow [5]), a level decline occurs, and this deterioration can be blocked. This is because, as shown in 2B in FIG. 2, electrons are dropped into the valence band by nitrogen, and the level can be deepened. When electrons are injected, even if the level is elevated as shown by arrow [4] in 2B in FIG. 2 (from b0 state to b-1 state), the depth is the same as in the energy level before injection of electrons (a0 state in 2A in FIG. 2) in a charge accumulating film before introduction of nitrogen. In other words, shown in 2A in FIG. 2, a0 state (without electron injection) and b-1 state (with electron injection) are the same in energy level.

In the configuration according to the embodiment, both electrons and holes can be moved in and out of the emerging level. As a result, electrons are injected at the time of writing and holes are injected at the time of erasing.

The additive substance is introduced instead of Ti, Zr, or Hf of base material, and it is characteristic that a vacant state of electrons (that is, a state ready to introduce electrons) is generated in the band gap. In particular, in a substance of a perovskite structure such as $SrTiO_2$, $SrZrO_3$, $SrHfO_3$ or $Sr(Ti, Zr)O_3$, it is a greatest feature that an additive substance is introduced in the central position of oxygen octahedron called B site. For example, it is extremely important that W is substituted for Ti in $SrTiO_3$. At this time, a localized state appears in the $SrTiO_3$ gap for allowing introduction of electrons.

By contrast, a merely mixed state of a plurality of existing dielectric films, for example, a state of merely mixing $SrTiO_3$ and $WO_3$ is not assumed. In a mere mixture of $SrTiO_3$ and $WO_3$, a localized state for allowing introduction of electrons in $SrTiO_3$ does not appear.

From the viewpoint of stability, the substances can be further selected. For example, Os, Ru, Ir or Rh can be used.

To create oxygen defects in $SiO_2$ for forming the tunnel layer 4, energy of 5.2 eV is needed per half of oxygen molecule ($\frac{1}{2} O_2$). To create oxygen defects in $LaAlO_3$ for forming the block layer 6, energy of 4.7 eV is needed per half of oxygen molecule. Thus, to withdraw oxygen from oxide, energy of 4.7 eV or more seems to be necessary. Similar energy is needed in other tunnel layer or block layer.

When the stabilizing energy for oxidizing the additive metal (for example, Ru) is sufficiently smaller than 4.7 eV, it is expected that oxygen defects should not be created by withdrawing oxygen from the tunnel layer or block layer positioned at both sides of the charge accumulating layer. Hence, a metal additive substance smaller in stabilization energy by oxidation seems to be a more effective additive substance. Desirable additive substances are Os, Ru, Ir, or Rh.

Other additive substances of high-valence metal are stable as oxides, and thus usually do not deprive layers at both sides of oxygen. However, if an oxygen defect is formed in the charge accumulating layer, an oxygen defect may occur in the oxide film at both sides in other substances than Os, Ru, Ir, or Rh. In such a case, by supplying a proper amount of oxygen when forming the charge accumulating layer, the process can be devised to prevent forming of extra oxygen defect in the charge accumulating layer.

An appropriate amount of additive substance to be added will be explained.

First, the lower limit of amount of addition will be explained. The lower limit of amount of addition when the additive substance is distributed in the charge accumulating layer at area density of $\sigma[C/cm^2]$, will be explained. At this time, the threshold change depending on accumulated charge is about Vth $[V] \approx 1.8 \times 10^{-13} \times \sigma$. However, depending on the film thickness or dielectric constant of each dielectric film, a change of about one digit should be taken into consideration. In a significant range as Vth shift amount, as long as the area density at the interface is $1 \times 10^{12}$ cm$^{-2}$ or more, a Vth change of about ±0.2 eV is obtained, which is effective. When the area density is $5 \times 10^{12}$ cm$^{-2}$ or more, a sufficient shift amount (±1.0 eV) is assured.

Figure 6:
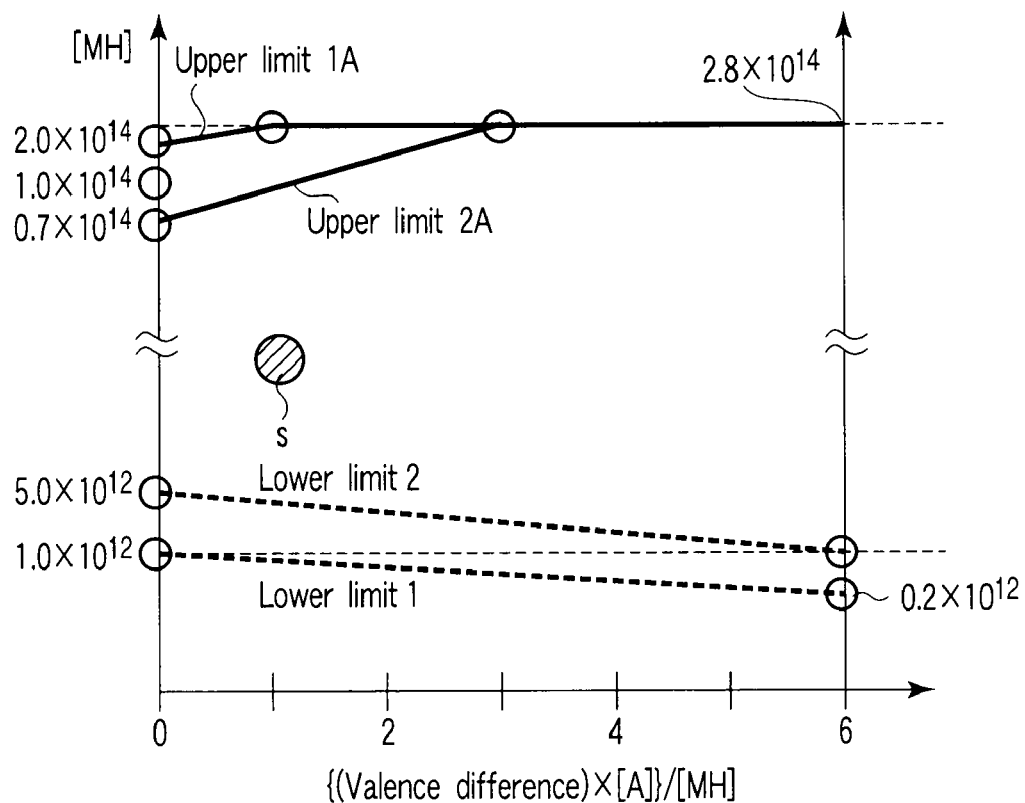
FIG. 6 is a diagram showing an optimum two-dimensional range in the case of addition of both at least one of group A high-valence substances (Tc, Re, Ru, Os, Rh, Ir, Pd, Pt, Co, or Ni), and at least one of nitrogen, carbon, boron, and low-valence substance.
Figure 7:
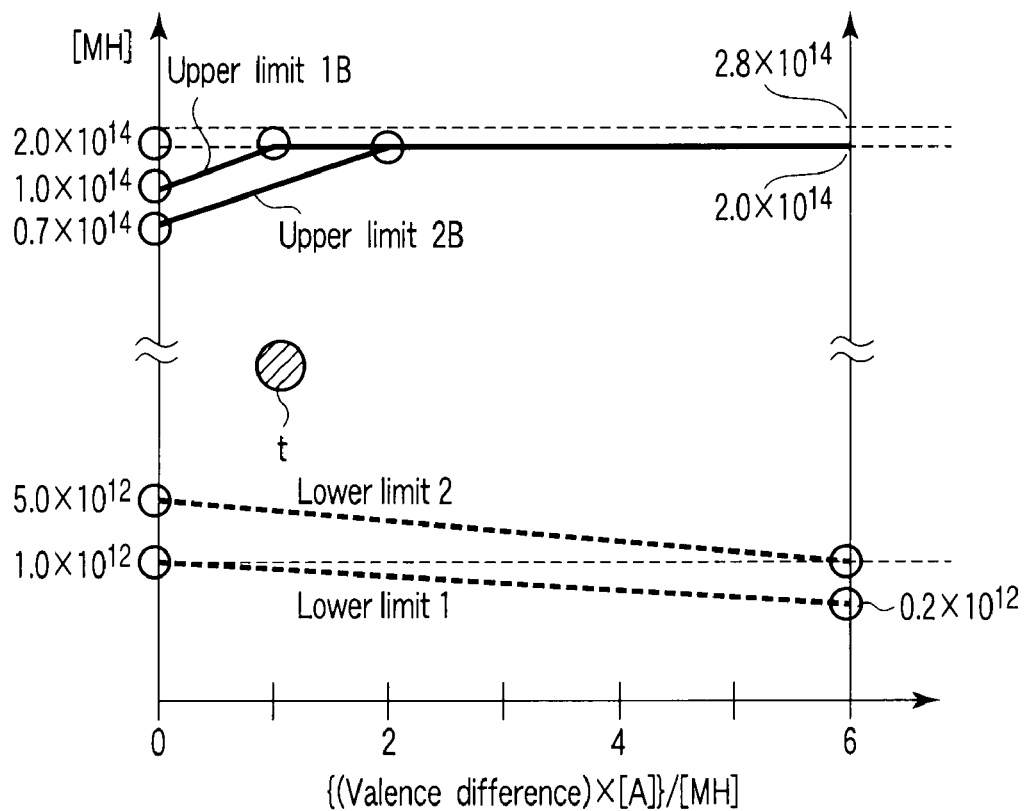
FIG. 7 is a diagram showing an optimum two-dimensional range in the case of addition of both at least one of group B high-valence substances (W, Mo, Cr, Mn, or Fe), and at least one of nitrogen, carbon, boron, and low-valence substance.
Figure 8:
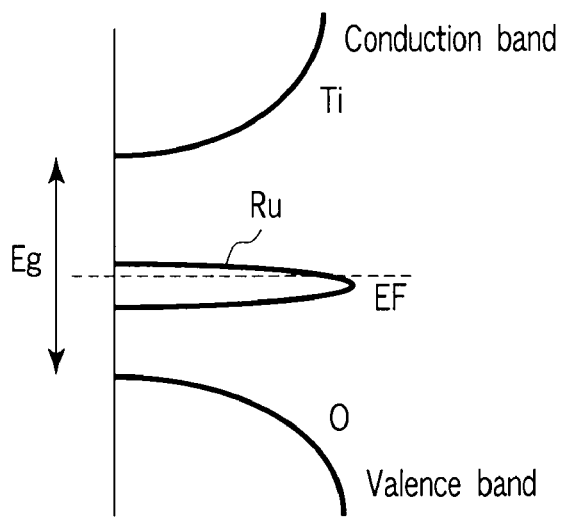
FIG. 8 is a diagram showing an electron state in the case of addition of Ru to Ti oxide.

The lower limit values denoted on the axis of ordinate in FIGS. 6 and 7 (when the axis of abscissa is zero) represent these values. The range of amount of additive substances to be introduced is shown in FIGS. 6 and 7. FIG. 6 shows the case where Tc, Re, Ru, Os, Rh, Ir, Pd, Pt, Co, or Ni is introduced as high-valence substance group A, and FIG. 7 shows the case where W, Mo, Cr, Mn, or Fe is introduced as high-valence substance group B.

The high-valence substance amount to be introduced is supposed to be [MH]. On the axis of abscissa in FIGS. 6 and 7, supposing the amount of nitrogen, carbon, boron, or low-valence substance to be [A], the value of {valence difference × [A]}/[MH] is plotted. The valence difference is a valence difference from oxygen in the case of nitrogen, carbon or boron. Oxygen can accept two electrons, while nitrogen N can accept up to three, carbon C up to four, and boron B up to five. Accordingly, the electrons can be received on the top of valence band, and the amount thereof is one in nitrogen, two in carbon, and three in boron. In this embodiment, the electron acceptable space on the top of valence band is called a valence difference.

In the case of nitrogen, the valence difference is 1, and the axis of abscissa is [N]/[MH]. In the case of carbon, the valence difference is 2, and the axis of abscissa is {2×[carbon]}/[MH]. In the case of boron, the valence difference is 3, and the axis of abscissa is {3×[boron]}/[MH]. In the case of low-valence substance, the valence difference is a difference from valence of IV (base material such as Ti, Zr, or Hf). That is, in a substance of valence of II (Ba, Sr, Ca, Mg), the valence difference is 2, and in a substance of valence of III (Al, Sc, La, Lantanoide), the valence difference is 1.

That is, in valence II substance (such as Ba, Sr, Ca, or Mg), the valence difference is 2, and the axis of abscissa is {2×[valence II substance]}/[MH]. In valence III substance, the valence difference is 1, and the axis of abscissa is {1×[valence III substance]}/[MH].

As explained in 2B in FIG. 2, as the electrons of the portion of valence difference are dropped into the valance band, the level becomes deeper, the state is more localized, and the optimum range changes. This mode is shown in FIGS. 6 and 7. The detail will be explained below.

The Lantanoide includes Ce, Pr, Nd, Pm, Sm, Eu, Gd, Tb, Dy, Ho, Er, Tm, Yb, and Lu. These substances have valance of III as a stable state, and by addition, electrons create a vacant state in the valence band.

Suppose a high-valence substance has been already added. When nitrogen, carbon, boron, or low-valence substance is introduced, the charge amount accumulated in one high-valence substance is increased. That is, the lower limit is widened. For example, if the nitrogen amount and high-valence substance amount are equivalent, one vacancy is opened for an electron. If the nitrogen amount is 2 times the high-valence substance amount, two vacancies are opened for electrons. The lower limit is generally suggested to be 6 which is the maximum number of electrons to be occupied (when orbit d of introduced substance is condensed three times, two electrons are allowed per orbit, and hence 3 times of condensation×2 electrons=6), and hence $1 \times 10^{12}$ cm$^{-2}$/6 to $0.2 \times 10^{12}$ cm$^{-2}$. In order to have a sufficient shift amount, as explained already, 5 times is desired, that is, $5 \times 0.2 \times 10^{12}$ cm$^{-2}$ to $1.0 \times 10^{12}$ cm$^{-2}$. These values are lower limit values when 6 are plotted on the axis of abscissa in FIGS. 6 and 7. The above concept of the lower limit is linearly approximated in FIG. 6 (the lower limit is the same in FIG. 7).

The upper limit of amount of addition will be explained. In the embodiment described below, an additive of high valence is substituted for the element constituting the oxide. That is, when only a mixture of oxide is handled, there is no particular condition for the mixing ratio. By contrast, not in the case of mixture of oxide, for example, in metal Ti in base material such as oxide TiO$_2$, a charge accumulating material displacing a metal additive substance such as W or Ru is employed. By using such charge accumulating material, an upper limit exists in the amount of metal additive substance.

In this embodiment, the added substance should not combine a band in the gap of the dielectric. If a band is combined, the charge is not localized, and it is equivalent to the FG type charge accumulating memory. A band is combined, for example, when additive substances (Tc, Re, Ru, Os, Rh, Ir, Pd, Pt, Co, Ni) enter a structure of 2a×2a×2a units (a is a lattice constant) in the unit cell. This is because the intrinsic energy level of the element for creating a state in the gap is apart from the intrinsic energy level of the element of base material, and thus the interaction with the base material is not so significant. To the contrary, if additive elements are not present in the structure of 2a×2a×2a units, band is not formed.

Hence, the upper limit is $2.0 \times 10^{14}$ cm$^{-2}$ in terms of area density. Further, if the oxide is a stable substance (W, Mo, Cr, Mn, Fe), it is possible that the charge should be spread widely through interaction with oxygen, and thus the additive substance must be 1 or less in the structure of 2.5a×2.5a×2.5a units. Hence, the upper limit is $1.0 \times 10^{14}$ cm$^{-2}$ in terms of area density. These values are upper limits 1A, 1B (in loose condition) of high-valence substance amount [MH] when the axis of abscissa is zero in FIGS. 6 and 7.

When the charge is introduced, the level tends to climb up, becoming closer to the level of the base material. At this time, in order to avoid interaction through the intrinsic level of the base material, preferably, the additive substance should be 1 or less in the structure of 3a×3a×3a units.

The upper limit in the embodiment is, more preferably, $0.7 \times 10^{14}$ cm$^{-2}$ in terms of area density. This value is upper limits 2A, 2B (in stricter condition) of high-valence substance amount [MH] when the axis of abscissa is zero in FIGS. 6 and 7.

When nitrogen, carbon, boron, or low-valence substance is introduced in the base material, the amount of charge accumulated per unit high-valence substance amount is increased. The charge accumulation level is deeper, and the charge is localized further. The upper limit is the value of maximum limit where the levels are linked and band is not combined.

As for additive substances Tc, Re, Ru, Os, Rh, Ir, Pd, Pt, Co, Ni, at the deepest level, it is known from calculation that the upper limit of additive substances is 1 or less in the structure of 1.5a×1.5a×1.5a units. This upper limit is $2.8 \times 10^{14}$ cm$^{-2}$ in terms of area density. This value is shown as the additive amount of maximum limit in FIG. 6. As for additive substances W, Mo, Cr, Mn, Fe, at the deepest level, it is known from calculation that the upper limit of additive substances is 1 or less in the structure of 2a×2a×2a units. This upper limit is $2.0 \times 10^{14}$ cm$^{-2}$ in terms of area density. This value is shown as the additive amount of maximum limit in FIG. 7.

Concerning the upper limit, in FIGS. 6 and 7, the quantity of {valence difference×[A]}/[MH] is plotted on the axis of abscissa. The amount of {valence difference×[A]}/[MH] is the quantity of electrons to be accepted by the added nitrogen, carbon, boron, or low-valence substance. The quantity is standardized per high-valence substance amount [MH]. If this value is m, it means that m electrons are extracted from the level created by the high-valence substance. At this time, the level energy is lowered, and the charge is localized, and therefore the upper limit is extended. Herein, m is an ordinary positive real number (for example, 0.95, or 1.75).

As shown in FIG. 6, as for additive substances Tc, Re, Ru, Os, Rh, Ir, Pd, Pt, Co, Ni, in initial state (zero on the axis of abscissa), the upper limit is $2.0 \times 10^{14}$ cm$^{-2}$, but it is elevated to $2.8 \times 10^{14}$ cm$^{-2}$ at {valence difference×[A]}/[MH]=1. When it is $0.7 \times 10^{14}$ cm$^{-2}$ in initial state (zero on the axis of abscissa), it is elevated to $2.8 \times 10^{14}$ cm$^{-2}$ at {valence difference×[A]}/[MH]=3.

That is, as the value increases in the direction of axis of abscissa, the number of electrons falling in the valence band increases, and the emerging level is localized. Therefore, even if more high-valence substance is added, FG is not formed. However, since there is a limit in localization and the upper limit is $2.8 \times 10^{14}$ cm$^{-2}$ as converted to the additive substance amount as explained above, further more high-valence substance cannot be added. If further exceeding, the wave functions of additive substances are overlapped with each other, and FG-like behavior takes place.

This concept of the upper limit is linearly approximated in FIG. 6.

It is also expressed in the following numerical formulas. In (s) of FIG. 6, for example, [Ru]=$3.5 \times 10^{13}$ cm$^{-2}$, and [N]=$4.0 \times 10^{13}$ cm$^{-2}$ are shown.

As shown in FIG. 7, as for additive substances W, Mo, Cr, Mn, Fe, in initial state (zero on the axis of abscissa), the upper limit is $1.0 \times 10^{14}$ cm$^{-2}$, but it is elevated to $2.0 \times 10^{14}$ cm$^{-2}$ at {valence difference×[A]}/[MH]=1. When it is $0.7 \times 10^{14}$ cm$^{-2}$ in initial state (zero on the axis of abscissa), it is elevated to $2.0 \times 10^{14}$ cm$^{-2}$ at {valence difference×[A]}/[MH]=2. This concept of the upper limit in FIG. 7 is the same as shown in FIG. 6. This concept of the upper limit is linearly approximated in FIG. 7. It is also expressed in the following numerical formulas. In (t) of FIG. 7, for example, [Cr]=$5.0 \times 10^{13}$ cm$^{-2}$, and [N]=$6.0 \times 10^{13}$ cm$^{-2}$ are shown.

The range of optimum value shown in FIG. 6 will be expressed in numerical formula.

In FIG. 6, the high-valence substances are Tc, Re, Ru, Os, Rh, Ir, Pd, Pt, Co, Ni (called first group Gr-A; herein as group A, subscript A is added to the upper limit as shown in FIG. 6). The range of upper limit and lower limit is from upper limit 1A to lower limit 1 in FIG. 6, first, as wide condition. The meaning of each numerical value in the diagram is already described above. Herein, the range is indicated by numerical expression.

The axis of abscissa in FIG. 6 is in the range of 0≦{valence difference×[A]}/[MH]≦1, and the axis of ordinate is in the range of $1.0 \times 10^{12}$ cm$^{-2}$-$1.3 \times 10^{11}$ cm$^{-2}$×{valence difference×[A]}/[MH]≦[MH]≦$2.0 \times 10^{14}$ cm$^{-2}$+$0.8 \times 10^{14}$ cm$^{-2}$×{valence difference×[A]}/[MH]. The additive substances in this range are effective.

Herein, $1.0 \times 10^{12}$ cm$^{-2}$-$1.3 \times 10^{11}$ cm$^{-2}$×{valence difference×[A]}/[MH] is a numerical expression of lower limit 1, and it means [MH] is higher than this lower limit 1.

Similarly, $2.0 \times 10^{14}$ cm$^{-2}$+$0.8 \times 10^{14}$ cm$^{-2}$×{valence difference×[A]}/[MH] is a numerical expression of upper limit 1A from 0 to 1 on the axis of abscissa, and it means that [MH] is lower than this upper limit 1A.

The axis of abscissa is in the range of $1 \leq \{\text{valence difference} \times [A]\}/[MH] \leq 6$, and the axis of ordinate is in the range of $1.0 \times 10^{12}$ cm$^{-2}$–$1.3 \times 10^{11}$ cm$^{-2} \times \{\text{valence difference} \times [A]\}/[MH] \leq [MH] \leq 2.8 \times 10^{14}$ cm$^{-2}$. The additive substances in this range are effective. Herein, each numerical expression is, as mentioned above, either a numerical formula expressing the lower limit 1 ($1.0 \times 10^{12}$ cm$^{-2}$–$1.3 \times 10^{11}$ cm$^{-2} \times \{\text{valence difference} \times [A]\}/[MH]$), or a numerical formula expressing the upper limit 1A (this is a constant herein, being $2.8 \times 10^{14}$ cm$^{-2}$).

The range determined by the above numerical expressions is shown in FIG. 6, and an effective and maximum wide range is shown as additive substances. A more stable memory action is realized in the range of upper limit 2A to lower limit 2.

The meaning of each numerical value in FIG. 6 has been already described above. Herein, the range is indicated by numerical expression. The axis of abscissa in FIG. 6 is in the range of $0 \leq \{\text{valence difference} \times [A]\}/[MH] \leq 3$, and the axis of ordinate is in the range of $5.0 \times 10^{12}$ cm$^{-2}$–$6.7 \times 10^{11}$ cm$^{-2} \times \{\text{valence difference} \times [A]\}/[MH] \leq [MH] \leq 0.7 \times 10^{14}$ cm$^{-2}$+$0.7 \times 10^{14}$ cm$^{-2} \times \{\text{valence difference} \times [A]\}/[MH]$. The additive substances in this range are effective.

Herein, $5.0 \times 10^{12}$ cm$^{-2}$–$6.7 \times 10^{11}$ cm$^{-2} \times \{\text{valence difference} \times [A]\}/[MH]$ is a numerical expression of lower limit 2, and it means [MH] is higher than this lower limit 2. Similarly, $0.7 \times 10^{14}$ cm$^{-2}$+$0.7 \times 10^{14}$ cm$^{-2} \times \{\text{valence difference} \times [A]\}/[MH]$ is a numerical expression of upper limit 2A from 0 to 3 on the axis of abscissa, and it means that [MH] is lower than this upper limit 2A.

The axis of abscissa is in the range of $3 \leq \{\text{valence difference} \times [A]\}/[MH] \leq 6$, and the axis of ordinate is in the range of $5.0 \times 10^{12}$ cm$^{-2}$–$6.7 \times 10^{11}$ cm$^{-2} \times \{\text{valence difference} \times [A]\}/[MH] \leq [MH] \leq 2.8 \times 10^{14}$ cm$^{-2}$. The additive substances in this range are effective.

Herein, each numerical expression is either a numerical formula expressing the lower limit 2 ($5.0 \times 10^{12}$ cm$^{-2}$–$6.7 \times 10^{11}$ cm$^{-2} \times \{\text{valence difference} \times [A]\}/[MH]$), or a numerical formula expressing the upper limit 2A (this is a constant herein, being $2.8 \times 10^{14}$ cm$^{-2}$). The range by these numerical expressions indicates the effective and strictest range as additive substances shown in FIG. 6.

The numerical expressions in FIG. 7 will be explained.

In FIG. 7, the high-valence substances are W, Mo, Cr, Mn, or Fe (called second group Gr-B; subscript B is added to the upper limit as shown in FIG. 7). The shown range is from upper limit 1B to lower limit 1 in FIG. 7, first, as wide condition. The meaning of each numerical value has been already described and is omitted. Herein, the range is indicated by numerical expression.

The axis of abscissa in FIG. 7 is in the range of $0 \leq \{\text{valence difference} \times [A]\}/[MH] \leq 1$, and the axis of ordinate is in the range of $1.0 \times 10^{12}$ cm$^{-2}$–$1.3 \times 10^{11}$ cm$^{-2} \times \{\text{valence difference} \times [A]\}/[MH] \leq [MH] \leq 1.0 \times 10^{14}$ cm$^{-2}$+$1.0 \times 10^{14}$ cm$^{-2} \times \{\text{valence difference} \times [A]\}/[MH]$. The additive substances in this range are effective.

Herein, $1.0 \times 10^{12}$ cm$^{-2}$–$1.3 \times 10^{11}$ cm$^{-2} \times \{\text{valence difference} \times [A]\}/[MH]$ is a numerical expression of lower limit 1, and it means [MH] is higher than this lower limit 1. Similarly, $1.0 \times 10^{14}$ cm$^{-2}$+$1.0 \times 10^{14}$ cm$^{-2} \times \{\text{valence difference} \times [A]\}/[MH]$ is a numerical expression of upper limit 1B from 0 to 1 on the axis of abscissa, and it means that [MH] is lower than this upper limit 1B.

The axis of abscissa show in FIG. 7 is in the range of $1 \leq \{\text{valence difference} \times [A]\}/[MH] \leq 6$, and the axis of ordinate is in the range of $1.0 \times 10^{12}$ cm$^{-2}$–$1.3 \times 10^{11}$ cm$^{-2} \times \{\text{valence difference} \times [A]\}/[MH] \leq [MH] \leq 2.0 \times 10^{14}$ cm$^{-2}$. The additive substances in this range are effective.

Herein, each numerical expression is, as mentioned above, either a numerical formula expressing the lower limit 1 ($1.0 \times 10^{12}$ cm$^{-2}$–$1.3 \times 10^{11}$ cm$^{-2} \times \{\text{valence difference} \times [A]\}/[MH]$), or a numerical formula expressing the upper limit 1B (this is a constant herein, being $2.0 \times 10^{14}$ cm$^{-2}$). These ranges indicate the effective and maximum wide ranges as additive substances shown in FIG. 7. A more stable memory action is realized in the range of upper limit 2B to lower limit 2.

The axis of abscissa in FIG. 7 is in the range of $0 \leq \{\text{valence difference} \times [A]\}/[MH] \leq 2$, and the axis of ordinate is in the range of $5.0 \times 10^{12}$ cm$^{-2}$–$6.7 \times 10^{11}$ cm$^{-2} \times \{\text{valence difference} \times [A]\}/[MH] \leq [MH] \leq 0.7 \times 10^{14}$ cm$^{-2}$+$6.5 \times 10^{13}$ cm$^{-2} \times \{\text{valence difference} \times [A]\}/[MH]$. The additive substances in these ranges are effective. Herein, $5.0 \times 10^{12}$ cm$^{-2}$–$6.7 \times 10^{11}$ cm$^{-2} \times \{\text{valence difference} \times [A]\}/[MH]$ is a numerical formula expressing the lower limit 2, and it means [MH] is higher than the lower limit 2. Similarly, $0.7 \times 10^{14}$ cm$^{-2}$+$6.5 \times 10^{13}$ cm$^{-2} \times \{\text{valence difference} \times [A]\}/[MH]$ is a numerical formula expressing the upper limit 2B from 0 to 2 on the axis of abscissa, and it means [MH] is equal to or lower than the upper limit 2B.

The axis of abscissa in FIG. 7 is in the range of $2 \leq \{\text{valence difference} \times [A]\}/[MH] \leq 6$, and the axis of ordinate is in the range of $5.0 \times 10^{12}$ cm$^{-2}$–$6.7 \times 10^{11}$ cm$^{-2} \times \{\text{valence difference} \times [A]\}/[MH] \leq [MH] \leq 2.0 \times 10^{14}$ cm$^{-2}$. The additive substances in this range are effective. Herein, each numerical expression is either a numerical formula expressing the lower limit 2 ($5.0 \times 10^{12}$ cm$^{-2}$–$6.7 \times 10^{11}$ cm$^{-2} \times \{\text{valence difference} \times [A]\}/[MH]$), or a numerical formula expressing the upper limit 2B (this is a constant herein, being $2.0 \times 10^{14}$ cm$^{-2}$). These ranges indicate the effective and strictest ranges as additive substances shown in FIG. 7.

The upper limits of the additive substances used in the embodiment, nitrogen, carbon, boron, or low-valence substance, will be explained. First, the relation to the total number of electrons will be explained.

The high-valence additive substances are Tc, Re, Ru, Os, Rh, Ir, Pd, Pt, Co, Ni, W, Mo, Cr, Mn, and Fe. When any one of these additive substances is introduced, the total number of electrons introduced into the level appearing in the gap of the charge accumulating layer is supposed to be [e]. The total introduction amount of nitrogen, carbon, boron, or low-valence substance is supposed to be [B], and the valence difference is K, hence K=1 (nitrogen), K=2 (carbon), K=3 (boron), K=2 (low-valence substance of valence II), and K=1 (low-valence substance of valence III). The number of electrons that nitrogen (or carbon, boron, low-valence substance) can accept is K×[B], and preferably $0 \leq \{K \times [B]\}/(e) \leq 1.0$.

This is because if the ratio exceeds 1, oxygen defects appear as many as the excess portion. Oxygen defects lead to a problem of an FG type, and a problem of destruction of base oxide to lower the long-term reliability. In view of these problems, there is a limit in the introduction amount of nitrogen, carbon, boron, or low-valence substance. In other words, if these substances are too much as compared with the introduced amount of high-valence substance, it is not desired because oxygen defects occur. A more preferable range is $0 \leq \{K \times [B]\}/(e) \leq 1.0$.

The matter discussed above will be further described by dividing into the amount of addition of high-valence substance and the number of electrons to be introduced. The amount of high-valence substances (additive substances) to be introduced as first group (Tc, Re, Ru, Os, Rh, Ir, Pd, Pt, Co, Ni, W, Mo, Cr, Mn, or Fe) is supposed to be [A]. The total amount of second group (nitrogen, carbon, boron, or low-valence substance (Mg, Ca, Sr, Ba, Al, Sc, Y, La or Lantanoide)) to be introduced is supposed to be [B]. Valence difference K, L is defined as follows: K=1 (nitrogen), K=2 (carbon), K=3 (boron), K=2 (low-valence substance of valence II), and K=1 (low-valence substance of valence III). Herein, valence difference K is the number of electron holes formed on the top of valance band (that is, the number of electrons that can be accepted). Hence, K×[B] is the number of electrons that can be accepted by nitrogen (or carbon, boron, or low-valence substance).

Valence difference L is L=the number of electrons in outermost nucleus of high-valence substance −4 (high-valence substance), for example, Cr is defined as L=6-4=2, and Ru as L=8-4=4. Valence difference L is the number of electrons per high-valence substance possessed by the high-valence substance in the level. When the metal of base oxide is a substance of valence IV, electrons are excessive by the portion of difference from valence IV, and are staying in the level. Hence, L×[A] is the number of electrons that can be released, existing inside of the level created by the high-valence substance. Preferably, the ratio of K×[B] and L×[A] is somewhere between 0 and 1. This is because, if the ratio exceeds 1, oxygen defects occur by the excessive portion. Oxygen defects lead to a problem of an FG type, and a problem of destruction of base oxide to lower the long-term reliability. Hence, an upper limit is determined in the amount of introduction of nitrogen, carbon, boron, or low-valence substance. That is, when these substances are too much as compared with the introducing amount of high-valence substance, it is not preferred because oxygen defects occur. Therefore, a preferred ratio is $0 \leqq \{K \times [B]\}/\{L \times [A]\} \leqq 1.0$.

As shown in the embodiment explained below, in the case of [N]≦[Ru], it is known that {K×[B]}/{L×[A]}=[N]/{4×[Ru]}≦0.25, and an improvement of charge holding characteristic is evident. At this time, the number of electrons in the level generated by Ru is 4, but since a nearly equivalent amount of nitrogen is introduced, one electron falls into the valence band, and three electrons are staying in the level. In this state, the charge is neutral, in which an electron or hole can be injected. Herein, the value of L of high-valence substance used in the embodiment is summed up as follows.

When the high-valence substance is Cr, Mo and W, L is 2. In the case of Mn, Tc and Re, L=3, in the case of Fe, Ru and Os, L=4, in the case of Co, Rh and Ir, L=5, and in the case of Ni, Pd and Pt, L=6.

Figure 9:
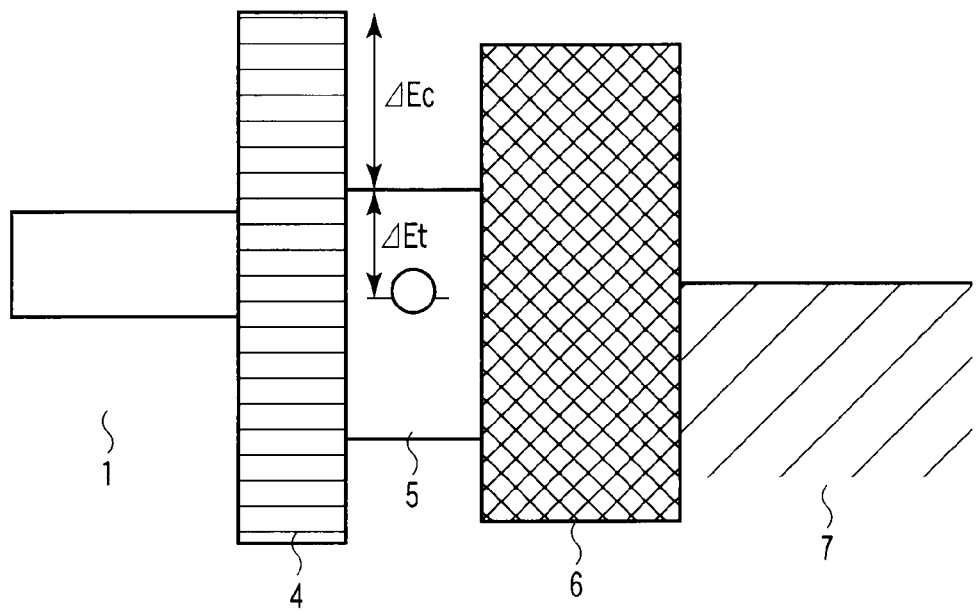
FIG. 9 is a schematic diagram of a band structure of a multi-layer film of a memory cell.

Back to FIG. 1, this is a sectional view showing essential parts of a cell of a nonvolatile semiconductor memory according to the first embodiment. FIG. 9 is a schematic diagram of a band structure of multi-layer films consisting of the first insulating layer (tunnel layer) 4, charge accumulating layer 5, second insulating layer (block layer) 6, and TaN control gate electrode (writing, reading, erasing control electrode) 7 sequentially stacked up on the silicon (Si—P type) substrate 1 shown in FIG. 1.

Figure 10:
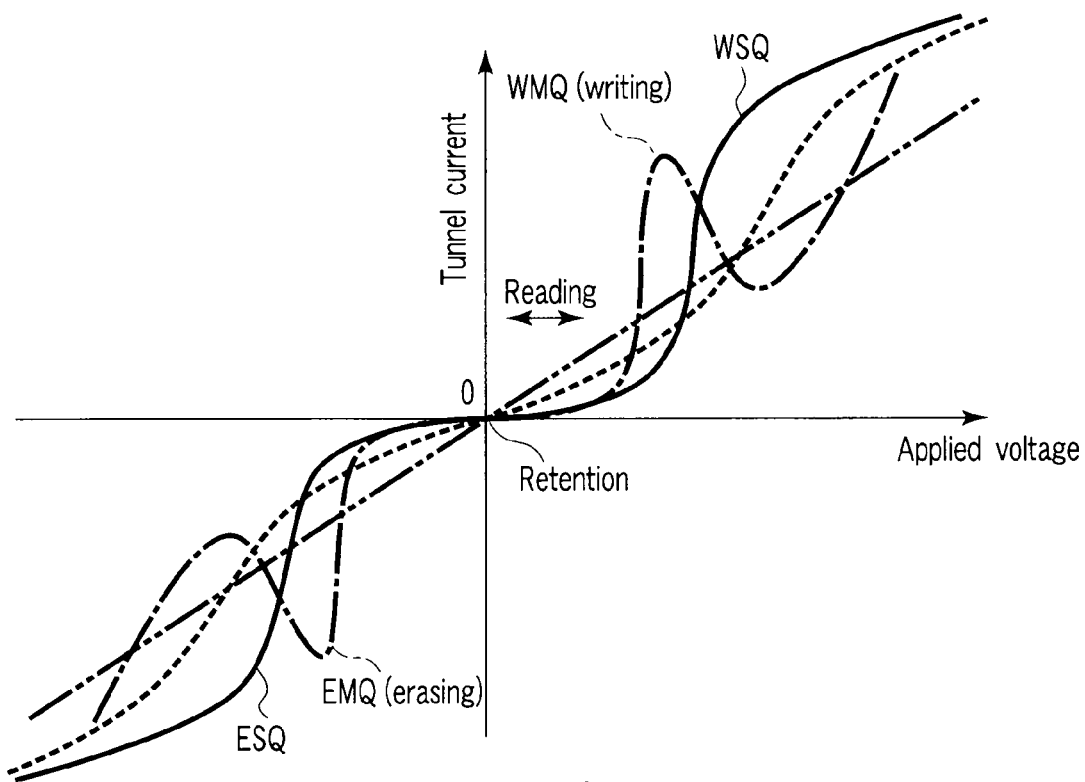
FIG. 10 is a characteristic diagram for explaining an applied voltage and a tunnel current when a tunnel film has a structure.

FIG. 10 is a diagram showing characteristics of applied voltage and tunnel current in the tunnel layer 4. In FIG. 10, a solid line denotes an ONO single quantum well film, a dotted line is an ONO multi-layer film (thickness without quantum effect), a single-dot chain line represents an ONONO double quantum well film, and a double-dot chain line shows a characteristic of an ordinary $SiO_2$ film.

Next, as shown in FIG. 1, a source region (S) 3 and a drain region (D) 2 are formed across a distance serving as a channel region 10 as a current passage for propagating data so as to be exposed on the surface of the silicon substrate 1. On this channel region 10, a gate (gate laminate) 9 is provided for controlling the memory action (writing, reading, and erasing). The distance (channel length) of the source region 3 and the drain region 2 is a distance properly set on the basis of the design specification of the memory, and is formed as a channel region.

This gate 9 is formed by laminating the tunnel layer 4 as the first insulating layer, the trap layer 5 as the charge accumulating layer, the block layer 6 as the second insulating layer having a high dielectric constant, and the control gate electrode 7, sequentially on the channel region 10 as a current passage. The detail of each layer will be described below.

The both ends of the tunnel layer 4 on the channel region 10 are formed to straddle over the source region 3 and drain region 2, respectively. The tunnel layer 4 is formed of a silicon oxide film of low dielectric constant, and its film thickness is 0.5 nm to 5 nm. In this embodiment, the film thickness is 2.4 nm.

The tunnel layer 4 is not particularly specified as long as the dielectric constant is low and the barrier can be maintained, and it can be formed not only by an $SiO_2$ film single layer, but also by a silicon oxynitride film or silicon nitride film, or a multi-layer film thereof. For example, a multilayer of $SiO_2/Si_3N_4/SiO_2$ can be used.

As mentioned above, in a conventional floating gate (FG) type memory, in order to operate normally, the tunnel layer 4 could not be formed in a thickness of 7 nm or less. In this embodiment, by introducing a discrete charge accumulating layer 5, a film thickness of 5 nm or less can be realized, and the tunnel layer can be reduced in thickness. The tunnel layer 4 will be more specifically described.

The tunnel layer 4 is not limited to a single-layer film such as $SiO_2$ or $Si_3N_4$, but can include a multilayer film such as $SiO_2/Si_3N_4/SiO_2$. Depending on the structure of the film, a very specific characteristic will be expressed. In the case of $SiO_2/Si_3N_4/SiO_2$, as indicated by the dotted line in FIG. 10 (ONO multi-layer film), a tunnel layer 4 having a characteristic of small leak in a low voltage region and much leak in a high voltage region can be formed. This characteristic occurs because the electron barrier changes depending on the voltage.

Herein, when the quantum level is generated by reducing the thickness of $Si_3N_4$ film of intermediate layer, as indicated by the solid line in FIG. 10 (ONO single-layer film), a tendency of smaller leak current at low voltage and larger leak current at high voltage is obtained. This is because the electron barrier is very high at low voltage where the quantum level cannot be used, but an effective electron barrier declines when and after the quantum level can be used.

A double quantum well film as shown in FIG. 11 will be described. In this case, it is important that two wells are different in width. In this example, the quantum levels formed in the quantum wells are mutually different. This state can be also realized by varying the substances for forming the wells. It is essential that the quantum levels are different between adjacent wells. At this time, at low voltage, adjacent quantum levels cannot resonate with each other (in off-resonance state), and thus the tunnel probability is almost zero. As the voltage is increased, adjacent quantum levels come to resonate with each other (in resonant-tunneling state), and the tunnel probability becomes almost 1. When the applied voltage is further increased, it is changed to the off-resonance state again.

This characteristic appears as voltage-leak current characteristic indicated by sing-dot chain line in FIG. 10. This voltage-leak current characteristic is in off-resonance state at low voltage, and hence the retention is excellent. It is the same in reading. Writing is very fast and highly efficient because the resonant state (position WMQ in FIG. 10) can be utilized, and the charge smoothly flows into the charge accumulating film. It is the same in erasing, and, for example, the resonant state (position EMQ in FIG. 1) can be utilized. In this structure, for erasing, the resonant-tunneling state of holes can be also utilized. This double well structure is the same in concept if one side is a quantum dot.

As explained herein, this tunnel layer can be used in a general charge accumulating memory (FG type, MONOS type). The off-resonance state is utilized in charge holding state after writing, in charge holding state after erasing, or in state reading. It is a great feature that resonant tunnel is used in writing and erasing.

In the off-resonance state, since there is almost no tunnel current, the retention is very high, and data fluctuation due to reading is almost none. The tunnel probability in the resonant state is almost 1, and writing or erasing is very fast. This is a special phenomenon brought about by a large contrast appearing in tunnel probability in the resonant state and off-resonance state, and the film structure of this phenomenon can be used in the embodiment.

In this embodiment, $SiO_2$ (film thickness of 2.4 nm) is used as basic form in the tunnel layer 4, and as comparative example, a structure using a double quantum well tunnel film of $SiO_2$ (0.6 nm)/$Si_3N_4$ (0.5 nm)/$SiO_2$ (0.9 nm)/Si-dots (0.6 nm)/$SiO_2$ (0.9 nm) will be explained.

FIG. 12 shows a structural example of a double quantum well tunnel layer 4.

This tunnel layer 4 has a three-layer structure consisting of a ($SiO_2$+Si dots) layer 4a, Si well layer 4b, and $SiO_2$ barrier layer 4c. Herein, the ($SiO_2$+Si dots) layer 4a forms a structure in which Si quantum dots of 0.6 nm in diameter are uniformly dispersed in the plane of $SiO_2$ of 1.8 nm. At this time, when about ±5 volts is applied to the tunnel layer 4, a resonant tunneling state occurs, and writing or erasing can be performed at high speed. In a low voltage region, since resonance does not occur, both charge retention characteristic after writing and charge retention characteristic after erasing are excellent.

In this embodiment, by using a high dielectric material in the charge accumulating layer 5, almost all applied voltage can be applied to the tunnel layer 4. As a result, the voltage necessary for memory action can be sufficiently lowered, and low-voltage driving is realized. Further, by this reduction of voltage, the applied voltage to the block oxide film can be lowered, and it is effective to prevent injection of electrons from the electrode side when erasing the stored data. That is, the electrode side electron injection can be suppressed.

A specified voltage is applied respectively to the control gate electrode 7 and drain region 2, with the result that the electrons having passed through the tunnel layer 4 are trapped in the charge accumulating layer 5. In the embodiment, the charge accumulating layer 5 is a $SrTiO_3$ film (film thickness 6 nm) having a high dielectric constant of, for example, 300. In the embodiment, as an example of a method of forming the charge accumulating layer 5, the silicon substrate 1 is heated, and $SrTiO_3$ target and $SrRuO_3$ target are co-sputtered in a mixed gas atmosphere of oxygen/nitrogen/argon, and thereby Ru is introduced. By controlling the nitrogen amount when forming a film, nitrogen is introduced into the film. After forming the film, the film is annealed in a mixed atmosphere of nitrogen/oxygen.

In the embodiment, the quantity of Ru introduced at the time of forming the film is $3.5 \times 10^{13}$ cm$^{-2}$ in terms of area density, so that a large accumulated charge amount can be obtained. The introduced nitrogen amount was about $4 \times 10^{13}$ cm$^{-2}$. At this time, Ru forms a level in the $SrTiO_3$ gap, and about 50% of the level is filled with electrons. By introduction of nitrogen in nearly equivalent amount of Ru, a state of one electron in the level is an extra vacancy, and the level is lowered by about 0.3 eV.

In the remaining about 50%, electrons can be filled in partly or entirely as shown in FIG. 5. Alternatively, about 50% of the filled electrons can be partly or entirely extracted. That is, when erasing the data, it is easy to extract electrons excessively, or it is easy to inject holes, and the threshold voltage can be shifted to a minus side. In such configuration, a large threshold variation width in a short time can be assured, and it is advantageous for storing action and erasing action.

As mentioned above, in the conventional silicon nitride film, it was very difficult to trap the holes, or extract the electrons excessively, and a sufficient threshold variation width was not assured. In the embodiment, by contrast, a large threshold variation width by excessive extraction of electrons can be assured, and erasing at high speed is realized.

In the charge accumulating layer 5 of the embodiment, as shown in FIG. 9, the energy level of charge accumulation exists at a very deep position. Accordingly, the charge leak is suppressed by far as compared with that of a silicon nitride film. When the charge accumulating layer 5 is titanium oxide, $\Delta Ec$ shown in FIG. 9 is as large as 3.5 eV, and the trap level $\Delta Et$ is also very large, about 1.7 eV in the case of Ru. A general silicon nitride film is $\Delta Ec \leq 1.1$ eV and $\Delta Et \leq 0.8$ eV. Further, by introducing nitrogen, carbon, boron or low-valence substance as in the embodiment, $\Delta Et$ can be further increased, and improvement of retention is expected.

By an additive substance, the value of $\Delta Et$ varies, and more than 0.5 eV can be maintained by the additive substances of the embodiment (Tc, Re, Ru, Os, Rh, Ir, Pd, Pt, Co, Ni, W, Mo, Cr, Mn, or Fe). As in the embodiment, by introducing nitrogen, carbon, boron or low-valence substance, $\Delta Et$ can be increased by about 0.3 eV.

When Hf oxide or Zr oxide is used in base material, $\Delta Ec$ is about 2.0 eV, which is lower than that in titanium oxide. However, the trap level is deeper than that of titanium oxide, and $\Delta Et$ can be kept at 1.5 eV. Thus, in the embodiment, a material of very deep trap level ($\Delta Ec + \Delta Et$ in FIG. 9) is specified, and the advantage of great blocking capability of accumulated charge loss is utilized. Further, in the embodiment, by introducing nitrogen, carbon, boron or low-valence substance, $\Delta Et$ can be increased, and further improvement of retention is expected.

In the case where Ti and Zr (or Hf) are contained, the band gap is generated depending on the content of these elements. The other features are exactly the same. For example, Sr(Ti, Zr)$O_3$ is an effective base material, and when Ru is substituted for Ti or Zr, an effective charge accumulating layer can be formed.

Thus, it is suggested that, by making use of merits of the charge accumulating layer 5 of the embodiment, that is, "assurance of large accumulated charge amount" and "strong blocking capability of accumulated charge loss," as compared with the conventional memory using a silicon nitride film as the charge accumulating layer, the thickness of the tunnel layer 5 can be further reduced, and a thinner film of the tunnel layer 5 can be realized. As a result, high speed operation is realized in all actions of data writing action, erasing action, and reading action.

Moreover, in the embodiment, the film thickness of the tunnel layer 5 can be reduced to less than several units of nm, and an outstanding effect is expected from the viewpoint of suppressing interaction of cells. It is very effective as a technology of promoting scaling in tune with future demands for high integration and thinner design, and producing memories of less than 30 nm or even smaller technology node (International Technology Roadmap for Semiconductor).

On the other hand, viewing the charge comprehensively, it is evident that the structure should be deformed so as to be capable of trapping a hole. In the conventional silicon nitride film, however, it is difficult to trap a hole, and it is attempted to write by injecting an electron and erase by extracting an electron. In the charge accumulating layer of the embodiment, it is easy to form a structure for trapping a hole, and an inverted structure should be also taken into consideration.

As explained herein, according to the nonvolatile semiconductor memory of the embodiment, the accumulated charge amount is increased outstandingly, the threshold variation width will be increased substantially, and a large portion of applied voltage between gate and channel will be applied to the tunnel layer. Therefore, the memory action of high speed and low voltage is realized.

A first modified example of the first embodiment will be described below.

Figure 4:
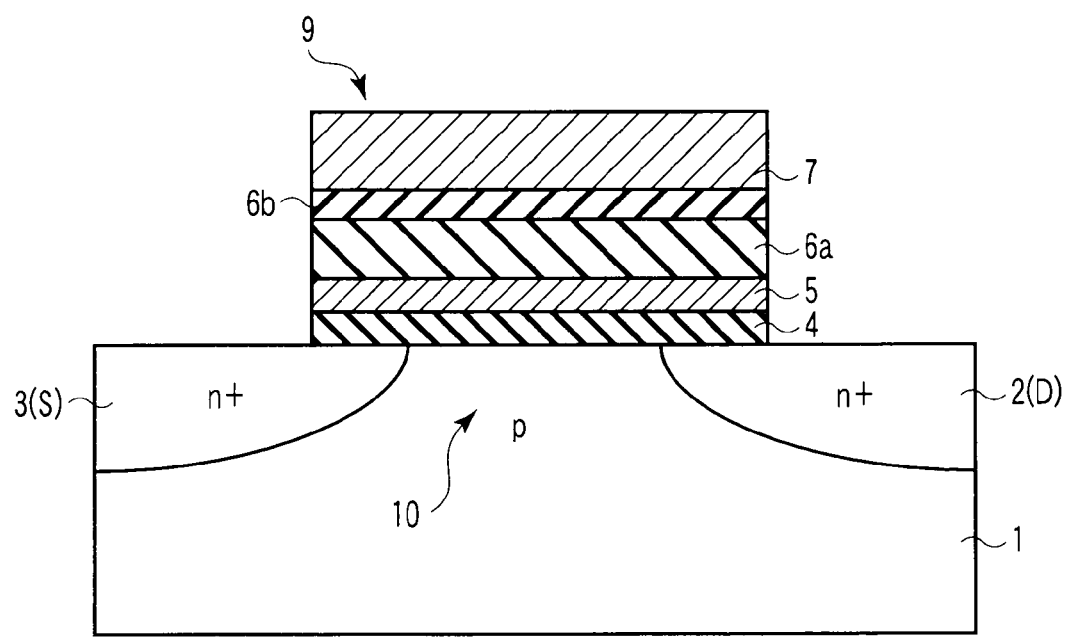
FIG. 4 is a sectional view of a structure having a block layer of multi-layer structure according to a first modified example of the first embodiment.
Figure 13:
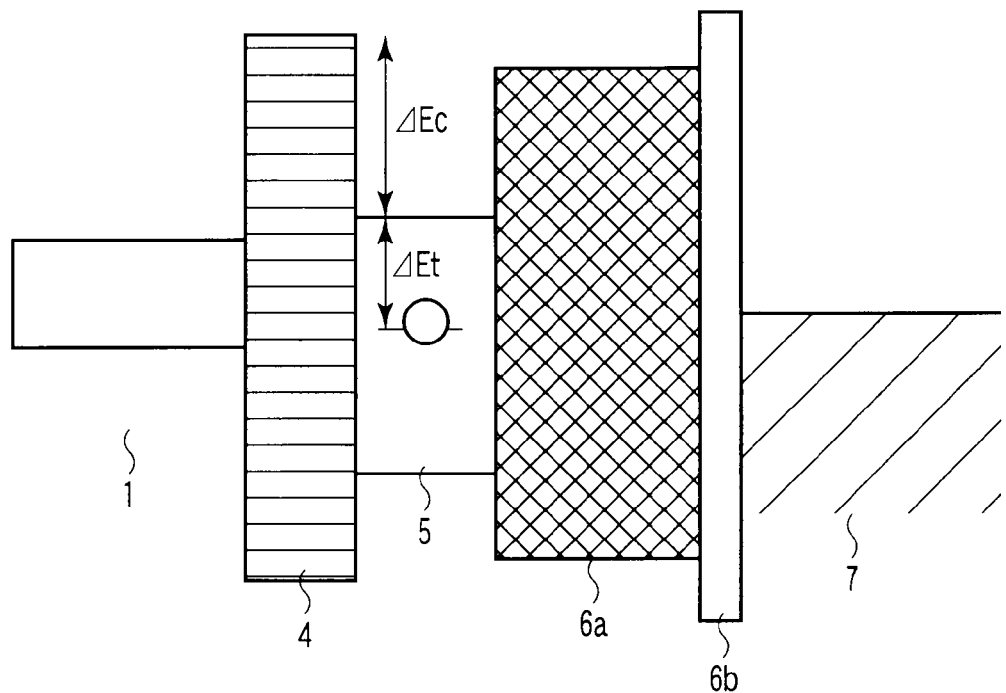
FIG. 13 is a schematic diagram of a band structure of a multi-layer film of a block film in the first modified example of the first embodiment.

FIG. 4 is a sectional view of essential parts of a memory cell in the first modified example. FIG. 13 schematically shows a band structure of multi-layer films consisting of a first insulating layer (tunnel layer), charge accumulating layer, second insulating layer (block layer), and control gate electrode (writing, reading, erasing control electrode) sequentially multi-layer on a silicon substrate.

In this first modified example, as shown in FIG. 4, the block layer 5 formed of an insulating layer has a multi-layer structure of a first block layer 6a and a second block layer 6b. The second block layer 6b blocks entry or exit of electron in and out of the control gate electrode 7 from the charge accumulating layer 5. It is important that electrons should be enclosed when holding or reading the memory, and when erasing the data, it is important to block electron injection from the electrode side. For blocking electron injection, it is most effective to use a material of high dielectric constant to prevent application of voltage. In this modified example, for this purpose, it is proposed to user a film made of at least one of materials of high dielectric constant selected from the group consisting of $LaAlO_3$, $Al_2O_3$, AlN, AlNO, $ZrO_2$, $SrZrO_3$, (Ba, Sr, Ca) $ZrO_3$, $La_2Zr_2O_7$, $HfO_2$, $SrHfO_3$, (Ba, Sr, Ca) $HfO_3$, and $La_2Hf_2O_7$, or a multi-layer film composed of plural layers of these films.

It is also effective to heighten the electron barrier by using a control gate electrode 7 of large work function. In spite of high work function, if plus charges are staying in the first and second block layers 6a, 6b, and the barriers of the first and second block layers 6a, 6b are low, it is the same as when the work function is low. To prevent such phenomenon, in the embodiment, an $Al_2O_3$ film is used in the second block layer 6b as shown in FIG. 13. In addition to the first block layer 6a, the second block layer 6b is disposed at the electrode 7 side, by introducing an $Al_2O_3$ film, Al-rich $LaAlO_3$ film, AlN film, or AlNO film.

As described below, to the contrary, the second block layer 6b can be disposed by introducing an Al-poor $Al_2O_3$ film, $LaAlO_3$ film, AlN film, or AlNO film. Similarly minus charges are accumulated in the second block layer 6b, and the same effects are obtained.

By such configuration, generation of plus fixed charge of the block layers 6a, 6b can be prevented, and further the barriers against electrons become higher. That is, if an electrode of high work function is used, it is effective to laminate an $Al_2O_3$ film (block layer 6b) simultaneously in the interface of the electrode 7 and the block layer 6a. By such configuration, the electron injection from the electrode 7 side when erasing the data can be efficiently prevented. In this embodiment, as shown in FIG. 4, a structure of $LaAlO_3$ film (5 nm)/$Al_2O_3$ film (1 nm)/TaN is proposed.

Herein, the metal-rich region setting in the second block layer 6b will be explained. When a region deviated to the metal-rich side from stoichiometry or a thin film is contained, the potential of the block layer can be controlled. An example will be explained below, in which "an excessively introduced metal" is concentrated in a width of about 1 nm in film thickness direction, and distributes in an area density of $\sigma[C/cm^2]$. At this time, the potential change is about $V[V] \approx 1.8 \times 10^{-14} \times \sigma$. A significant range as potential shift amount V will be explained below.

In a film thickness of 1 nm, if the change is 0.1 V or more, the tunnel probability is considered to be decreased to about 10%, and the shift of 0.1 V or more as the potential is very important. As the potential, when 1.0 V or more can be changed, the tunnel probability can be improved by three digits or more as compared with before changed, but actually since the hole side barrier is lowered, the upper limit can be considered at 1.0 V. That is, considering the potential shift V, it is significant in the range of 0.1 V to 1.0 V, and there is no meaning if going out of this range.

Hence, the area density of "the excessively introduced metal" is preferred to be $5 \times 10^{12}$ cm$^{-2}$ or more to $5 \times 10^{13}$ cm$^{-2}$ or less. However, considering also the distribution of "the excessively introduced metal" in the film thickness direction, the lower limit can be changed by about 0.5 times, and the upper limit by about 2 times. Hence, considering the film thickness direction distribution of "the excessively introduced metal", the optimum area density of "the excessively introduced metal" is $2.5 \times 10^{12}$ cm$^{-2}$ or more to $1 \times 10^{14}$ cm$^{-2}$ or less.

To the contrary, the second block layer 6b can be formed of a region deviated to the metal-poor side from stoichiometry. This mechanism is different from metal-rich side, but the same concept can be applied in the required quantity. That is, at the metal-poor side, metal defects occur, and holes of positive charge are excessively present in the defect areas (at this moment, the total charge is zero), but electrons flow into these holes, and it is known that the electrons are stabilized once flowed into the hole. At this time, the entire film is negatively charged, and the electron barriers are elevated. Although the mechanisms are different, the results were the same at the metal-rich side. In other words, deviation from stoichiometry is effective for fixing the electrons.

A second modified example of the first embodiment will be explained.

In the second modified example, the base material of the charge accumulating layer 5 is changed from $SrTiO_3$ to $TiO_2$. The multi-layer structure is the same as explained in FIG. 1.

The charge accumulating layer is formed in the same manner as the $SrTiO_3$ film described above, that is, using $TiO_2$ target and $RuO_2$ target, the layer is formed on the tunnel layer by co-sputtering in a mixed gas atmosphere of oxygen/nitrogen/argon. By controlling the nitrogen amount in film forming process, nitrogen is introduced into the film. After forming the film, it is annealed in a mixed gas atmosphere of nitrogen/oxygen.

The formed film of $TiO_2$ has a rutile structure. The rutile structure is like $TiO_6$ octahedron buried in simple cubic lattice of Ti, and it is crushed in C-axis direction. It is similar to the perovskite structure in the point that $TiO_6$ octahedron is contained.

The introduced amount of Ru is $5.0 \times 10^{13}$ cm$^{-2}$ in terms of area density, so that a large charge accumulated amount is obtained. The introduced nitrogen amount was about $1.0 \times 10^{14}$ cm$^{-2}$. At this time, Ru forms a level in $TiO_2$ gap, and about 33.3% of the level is filled with electrons. By introduction of nitrogen by about double amount of Ru, the portion of two electrons in the level becomes vacant, and the level is lowered by about 0.5 eV. The remaining portion of about 66.6% can be partly or entirely filled with electrons.

About 33.3% of filled electrons can be extracted partly or entirely. That is, when erasing the data, it is easy to extract electrons excessively (or inject holes), and the threshold voltage can be shifted to the minus side. As a result, the threshold variation width can be increased in a short time, and it is advantageous for writing, reading or erasing action (that is, by excessive extraction of electrons, a large threshold variation width is assured, and fast erasing is realized). As the difference between base material of $SrTiO_3$ and base material of $TiO_2$, the dielectric constant is 300 in $SrTiO_3$, and is lowered to 100 in $TiO_2$. On the other hand, the $TiO_2$ film is composed of Ti only, and the process is simple, and the cost can be saved.

A third modified example of the first embodiment will be explained.

In the third modified example, as in the second modified example, a metal-poor layer is introduced in part of the block layer 6. The structure is the same multi-layer structure as in FIG. 4, and explanation of the structure is omitted.

Figure 14:
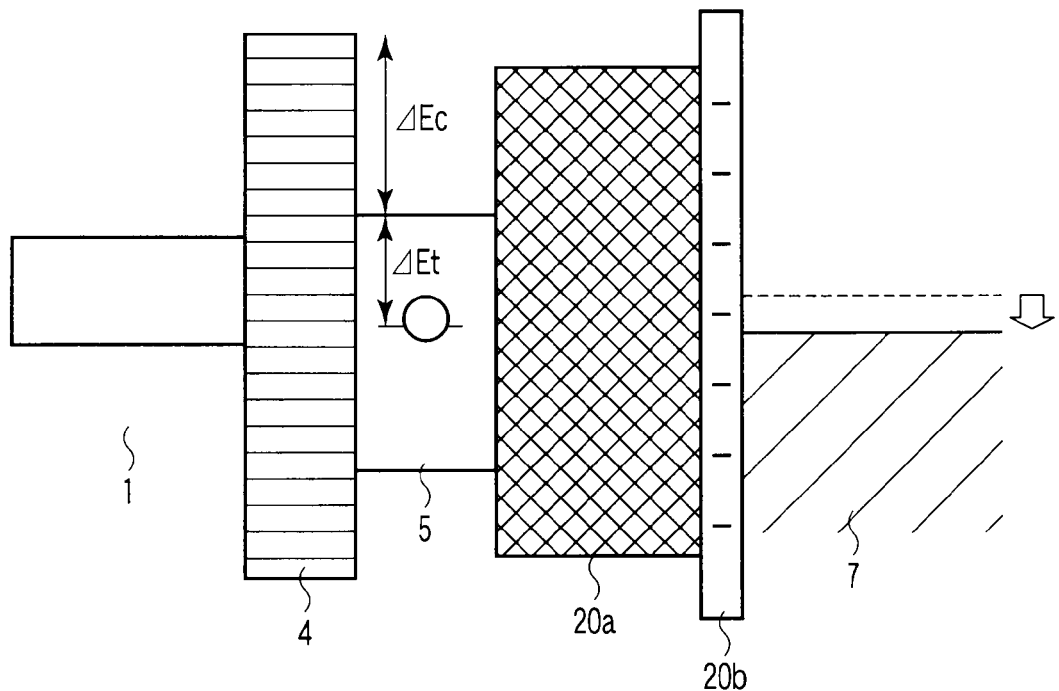
FIG. 14 is a schematic diagram of a band structure of a multi-layer film of a block film in a third modified example of the first embodiment.

Since a minus charge is introduced in this metal-poor layer, the electron carrier is built up, and the blocking performance to electrons is enhanced substantially. The memory structure is shown in FIG. 14, in which silicon (Si—P type) substrate 1, $SiO_2$ tunnel layer (2.4 nm) 4, $SrTiO_3$:Ru (6 nm) 5, $LaAlO_3$ (5 nm) 20a, Al-poor $Al_2O_3$ (1 nm) 20b, and TaN electrode 7 are laminated.

As compared with the structure of the first embodiment, the voltage at the time of erasing the data is higher, and the data can be erased at higher speed. The band structure is as shown in FIG. 14, and the electron barrier looks higher as seen from the side of the electrode 7. Herein, a film is formed by introducing oxygen excessively in $Al_2O_3$, but the deficient Al amount in the Al-poor $Al_2O_3$ film (equivalent to excessive introduction of oxygen) was $1\times10^{13}$ $cm^{-2}$.

Hence, according to the third modified example, the charge amount is abundant, and by extracting the electrons excessively from the charge accumulating layer, Vth can be largely changed to the minus side, and multiple values can be easily obtained.

As explained herein, according to the first embodiment and the first to third modified examples thereof, by forming a charge accumulating layer of high dielectric constant composed of Ti oxide having dielectric constant of 30 to 1000, Zr oxide or Hf oxide having dielectric constant of 20 to 30 in the memory structure, the majority of applied voltage can be applied to the tunnel layer, and operation at high speed and low driving voltage can be realized. At this time, when the second insulating layer (block layer) is formed in multiple layers and the dielectric constant is further enhanced, the voltage can be much lowered.

When the base material is formed by Ti, Zr or Hf, or oxide formed of these elements and a high-valence substance is added thereto, an electron trap level is generated in the band gap. This electron trap level is very deep and stable, and can accumulate sufficient charge. As a result, the thickness of the tunnel layer and the block layer can be thinned, and operation at high speed is realized.

A second embodiment according to the invention will be described below.

Figure 15:
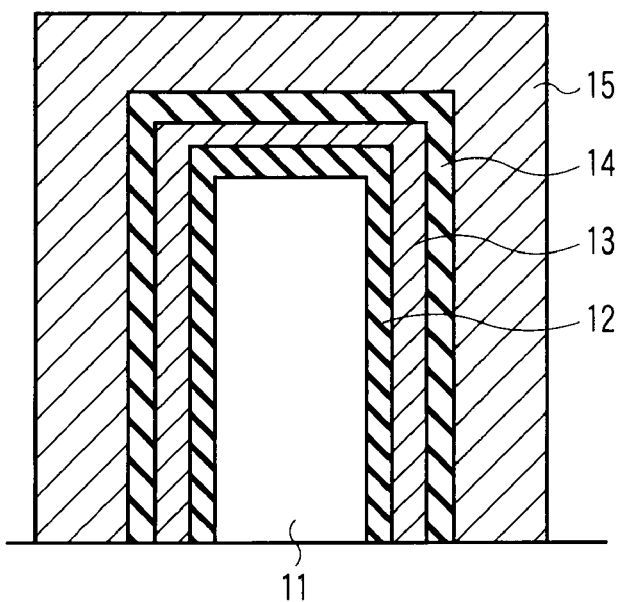
FIG. 15 is a side sectional view of a memory structure of a nonvolatile semiconductor memory according to a second embodiment.
Figure 16:
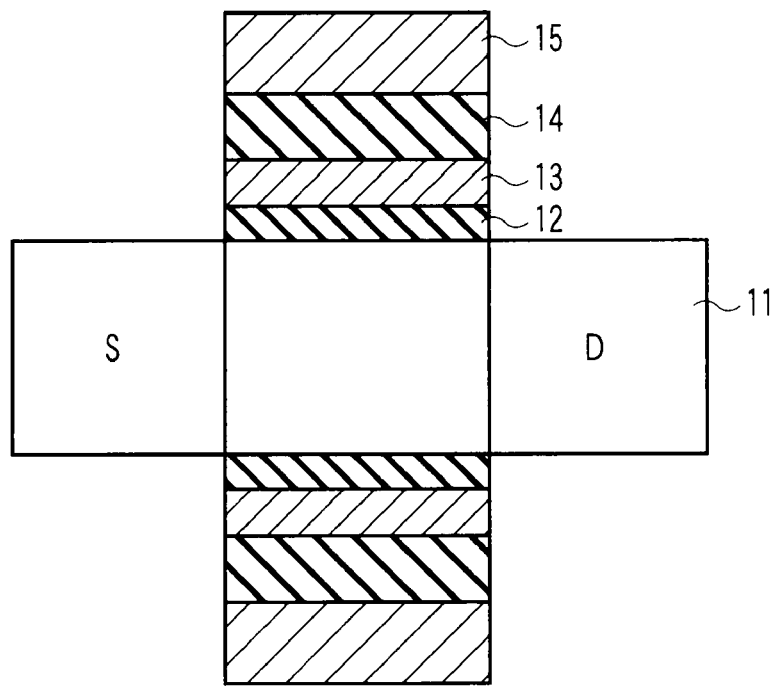
FIG. 16 is a top plan view of the memory structure of the nonvolatile semiconductor memory according to the second embodiment.

The nonvolatile semiconductor memory of the second embodiment shown in FIGS. 15 and 16 is a charge accumulating memory applied to fin structure. This charge accumulating memory will be explained by referring to an example of forming a fin FET type charge accumulating memory applying the STI technology using CVD method or ALD method.

This memory is shown in a side view in FIG. 15, in which a MONOS type charge accumulating memory is composed by covering the circumference of a fin section 11 composed of Si sequentially with a tunnel layer 12, charge accumulating layer 13, block layer 14 and electrode 15 in a cap shape.

As shown in a top view in FIG. 16, this memory is formed so that the fin section 11 is covered with the tunnel layer 12 in the channel portion as seen from above, and the source and drain portions are extended to both sides so as to contact with external elements. By optimizing the thickness of the channel portion of the fin section 11, the threshold value can be changed more significantly. A similar structure can be formed in the fin FET on SOI, and a further faster action is realized by using the fin FET structure.

A modified example of the second embodiment will be explained.

Figure 17:
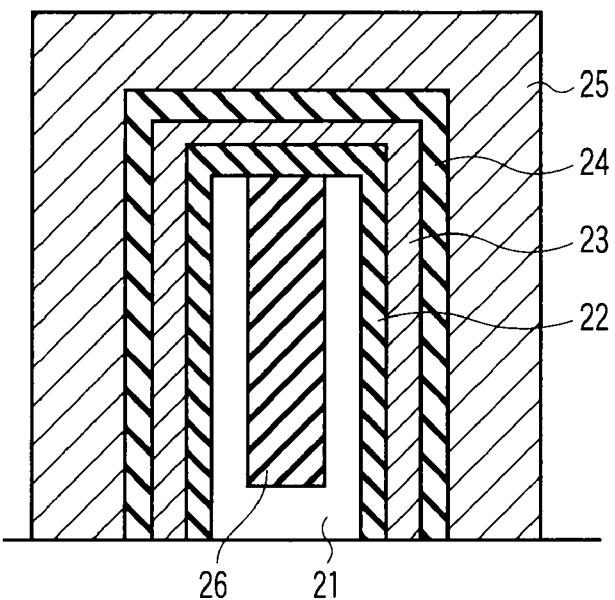
FIG. 17 is a side sectional view of a memory structure of a nonvolatile semiconductor memory in a modified example of the second embodiment.

This modified example is shown in FIG. 17, in which a MONOS type charge accumulating memory is composed by covering the circumference of a fin section 21 composed of Si sequentially with a tunnel layer 22, charge accumulating layer 23, block layer 24 and electrode 25 in a cap shape.

Figure 18:
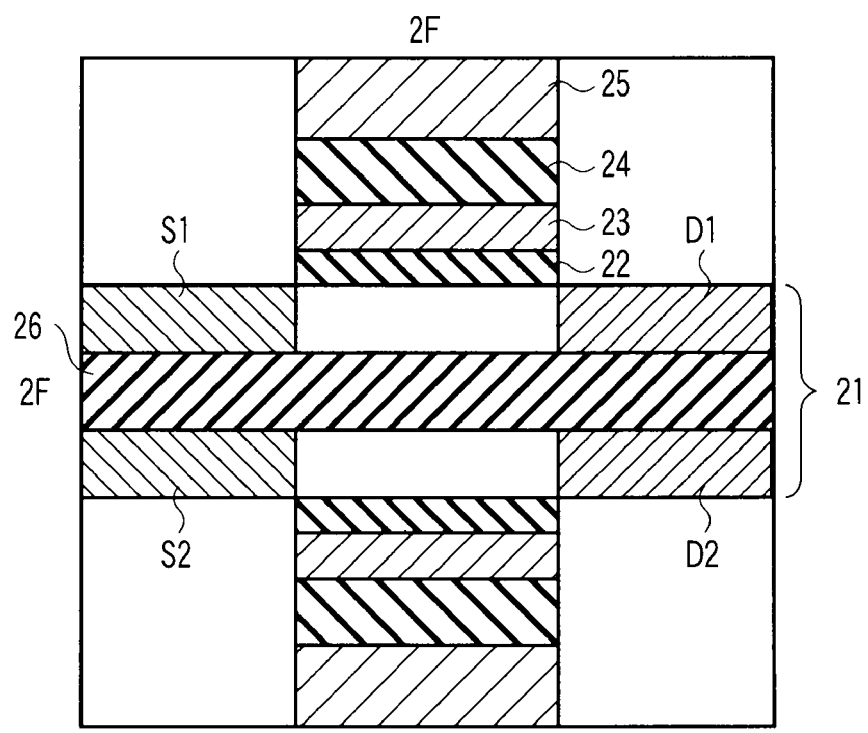
FIG. 18 is a top plan view of the memory structure of the nonvolatile semiconductor memory in the modified example of the second embodiment.

In this configuration, as shown in FIG. 18, as seen from the top, a buried barrier layer 26 is formed in the fin section 21, and the fin section 21 is equally divided into two portions. This barrier layer 26, when formed of the same material ($SiO_2$ or SiON) as the tunnel layer 22, can be formed simultaneously with the forming process of the tunnel layer. In the structure shown in FIG. 17, a storing action of 2-bit/$4F^2$ is enabled, and the bit density can be enhanced only by inserting a buried layer in the fin section.

The charge accumulating layer in the nonvolatile semiconductor memory (charge accumulating type memory) of the embodiment is composed by adding a proper amount of high-valence substance in order to generate a trap level capable of moving in and out the electrons therein, by using a substance of a sufficiently higher dielectric constant than silicon nitride film as base material. Further, by introducing nitrogen, carbon, boron, or low-valence substance, it is intended to control the number of electrons in trap level or the energy of trap level.

By other additive substance than those shown in the embodiments, such effects of the embodiments are not obtained. Comparative examples will be shown below. The following comparative examples 1 to 3 are different from the foregoing embodiments and modified examples thereof.

COMPARATIVE EXAMPLE 1

In this example, only La is added to $HfO_2$ as a charge accumulating layer. Herein, the result is the same when only other substance of La group is added (Ce, Pr, Nd, Pm, Sm, Eu, Gd, Tb, Dy, Ho, Er, Tm, Yb, Lu). As shown in FIG. 19, La in $HfO_2$ induces an oxygen defect, and is stable in this state. As a result, an electron state emerges near the conduction band, and it is mixed and spreads in the entire film through the interaction with Hf. As a result, when added by $1\times10^{12}$ $cm^{-2}$ in terms of area density, already, an n-type image is drawn.

These substances are considered to be introduced to increase oxygen defects. In this case, the accumulated electrons almost flow out by local defects of a tunnel layer, and the memory characteristic is very feeble. In this respect, it is the same as the floating gate type memory, and the tunnel layer cannot be reduced in thickness. As a result, the interference of mutually adjacent cells is increased, and scaling is not promoted.

COMPARATIVE EXAMPLE 2

As the charge accumulating layer, Nb (or V or Ta) is introduced in HfO$_2$. As shown in FIG. 20, unlike La, Nb does not induce oxygen defects, and Nb itself gives electrons to oxide such as HfO$_2$. As a result, a behavior like n-type is observed. By forming Ti oxide, Zr oxide, or Hf oxide in n-type, the tunnel layer can be reduced in thickness as in comparative example 1.

COMPARATIVE EXAMPLE 3

As the charge accumulating layer, oxygen defects are introduced in SrTiO$_3$. As shown in FIG. 21, if oxygen defects are small in quantity, a behavior like n-type is observed. That is, Ti oxide, Zr oxide, or Hf oxide is formed in n-type. As in comparative example 1, the tunnel layer cannot be reduced in thickness. A similar band structure is formed when oxygen defects are introduced in a TiO$_2$ film.

A representative configuration of the nonvolatile memory (charge accumulating memory) in the foregoing embodiments and modified examples is as follows.

The nonvolatile semiconductor memory includes: a silicon substrate having a source region and a drain region disposed across an interval as a channel region; a first insulating layer formed on the channel region; a charge accumulating layer having an oxide dielectric film of Ti, Zr or Hf containing at least one selected from a first group consisting of Tc, Re, Ru, Os, Rh, Ir, Pd, Pt, Co, Ni, W, Mo, Cr, Mn, and Fe, and at least one selected from a second group consisting of nitrogen, carbon, boron, Mg, Ca, Sr, Ba, Al, Sc, Y, La, and Lantanoide; a second insulating layer formed on the charge accumulating layer; and a control gate electrode formed on the second insulating layer.

The embodiments of the invention include the following method of manufacturing a nonvolatile semiconductor memory.

The method of manufacturing a nonvolatile semiconductor memory includes: forming, on a silicon substrate, a source region and a drain region across an interval as a channel region; forming a first insulating layer on the channel region; forming, on the first insulating layer, a charge accumulating layer having an oxide dielectric film of Ti, Zr or Hf containing at least one selected from a first group consisting of Tc, Re, Ru, Os, Rh, Ir, Pd, Pt, Co, Ni, W, Mo, Cr, Mn, and Fe, and at least one selected from a second group consisting of nitrogen, carbon, boron, Mg, Ca, Sr, Ba, Al, Sc, Y, La, and Lantanoide; forming a second insulating layer on the charge accumulating layer; and forming a control gate electrode on the second insulating layer.

The nonvolatile semiconductor memory (charge accumulating memory) of the embodiments and modified examples explained herein can bring about the following actions and effects.

1) Using a charge accumulating layer having a high dielectric constant, the voltage applied to the charge accumulating layer can be lowered, and the majority of applied voltage can be applied to the tunnel layer. As a result, writing, reading and erasing action at high speed and low driving voltage can be realized. Further, by heightening the dielectric constant of the second insulating layer (block layer) for entrapping the charge, a further lower voltage can be realized. When Ti oxide is used, a dielectric constant as high as 30 to 1000 will be possible. In Zr oxide or Hf oxide, a dielectric constant of 20 to 30 will be also possible.

2) By adding a high-valence substance to a high dielectric material composed of oxide of Ti, Zr or Hf, a level is generated in the band gap, and a sufficient charge accumulation is realized. Further, by introducing nitrogen (or carbon, boron, low-valence substance), the number of electrons in the trap level or the energy of the trap level can be controlled, a more charge accumulation amount is obtained, and the charge accumulation state can be maintained more stably.

3) The level occurring in the band gap is very deep and stable. Both of the tunnel layer and block layer can be thinner in the embodiment, as compared with the conventional structure of accumulating the charge in the silicon nitride layer. It is also possible to lower the barrier of the tunnel layer, and both thin film and high speed of action can be realized.

4) From the generated level, electrons can be moved in and out. Hence, electrons can be extracted excessively, and a large threshold variation width is assured. As a result, a multi-value design is easily realized.

5) Unlike control by oxygen deficiency, the film is not n-type semiconductor, and thus loss of charge by local defect of the tunnel layer can be prevented.

6) The problem is more serious in the control by oxygen deficiency. The greatest feature is that, when the charge is trapped by oxygen deficiency, the structure is largely deformed. By this deformation, the film itself will be deformed, and the long-term reliability will be deteriorated. The configuration of the embodiment is free from increase in oxygen deficiency.

7) The oxygen deficiency has another problem. That is, the surrounding oxygen moves to the oxygen deficiency position, and the oxygen deficiency substantially moves around. By such easy movement, the surrounding of oxygen deficiency may be crystallized. Since the crystal state is most stable, it approaches the most stable state in the course of moving around. Hence, the amorphous state cannot be maintained, crystal grains are generated, and the current leak pass may occur. The configuration of the embodiment is free from increase in oxygen deficiency.

8) By using a base material high in dielectric constant, the charge capturing sectional area can be increased, and thus the charge capturing efficiency becomes higher, and the threshold controllability is improved.

The embodiment relates to an example of configuration in which the memory cell structure of the embodiment is formed on the silicon substrate, but not limited to this example. A silicon layer can be formed on other substrate than the silicon substrate, such as a glass substrate, and the memory cell structure of the embodiment can be formed thereon. By utilizing this structure, a nonvolatile semiconductor memory can be formed in the control drive circuit of display element such as liquid crystal display element. Aside from the glass substrate, other substrate can be used as long as it is strong enough to withstand process temperature when forming a ceramic substrate and it does not generate undesired gas during the process.

The nonvolatile semiconductor memories of the foregoing embodiments can be installed in stationary or portable electronic appliances (such as personal computer, telephone, PDA, television, car navigation system, and recording and reproducing apparatus), and data, application software or programs can be stored therein and utilized. Moreover, image data and audio data can be accumulated in imaging devices (such as digital still camera, digital video camera). In addition, in the electronic household appliances, composite type printers and facsimile equipment making communication through the Internet, LAN and other network, the functions of the memory or hard disk drive (HDD) can be easily realized.

The invention is very useful for accumulating and saving data temporarily as in the memory and HDD of conventional equipment. Besides, in circuits of electronic components, it can be used in a memory mixed type system using the nonvolatile memory as an internal memory or cache memory of a system LSI or part of the electronic circuit. In a more advanced application, it can be assumed as a system LSI capable of programming a system (circuit functions) as desired.

In the foregoing embodiments, the MONOS type flash memory has been explained, but the invention can be easily applied to the memory circuit integrating MONOS type flash memories, or system LSI having logic circuits mounted on the same chip, and all these applications are included in the scope of the invention. Various changes and modifications can be conceived by those skilled in the art, and all these changes and modifications are understood to be embraced within the scope of the invention.

What is claimed is:

1. A nonvolatile semiconductor memory comprising:
a semiconductor substrate having a source region, a drain region, and a channel region between the source region and the drain region;
a first insulating layer formed on the channel region;
a charge accumulating layer formed on the first insulating layer and having an oxide dielectric film including a Ti oxide film, a Zr oxide film or a Hf oxide film, and the oxide dielectric film containing an element α selected from a first group consisting of Tc, Re, Ru, Os, Rh, Ir, Pd, Pt, Co, Ni, W, Mo, Cr, Mn and Fe, and an element β selected from a second group consisting of nitrogen, carbon, boron, Mg, Ca, Sr, Ba, Al, Sc, Y, La and Lantanoide, the element α and the element β being distributed in the oxide dielectric film;
a second insulating layer formed on the charge accumulating layer; and
a control gate electrode formed on the second insulating layer.

2. The memory according to claim 1, wherein the element α is substituted for the Ti, Zr or Hf in the oxide dielectric film,
in the case the element β is the nitrogen, carbon or boron in the second group, the element β is substituted for oxygen in the oxide dielectric film, and
in the case the element α is the Mg, Ca, Sr, Ba, Al, Sc, Y, La or Lantanoide in the second group,
the element β is substituted for the Ti, Zr or Hf in the oxide dielectric film.

3. The memory according to claim 1, wherein
in the case the element β is the Tc, Re, Ru, Os, Rh, Ir, Pd, Pt, Co, or Ni in the first group, the element β has an area density in the oxide dielectric film in the range of $2\times10^{11}$ cm$^{-2}$ to $2.8\times10^{14}$ cm$^{-2}$.

4. The memory according to claim 1, wherein
in the case the element α is the W, Mo, Cr, Mn or Fe in the first group, the element α has an area density in the oxide dielectric film in the range of $2\times10^{11}$ cm$^{-2}$ to $2\times10^{14}$ cm$^{-2}$.

5. The memory according to claim 1, wherein
the element α has an area density in the oxide dielectric film in the range of $5\times10^{12}$ cm$^{-2}$ to $0.7\times10^{14}$ cm$^{-2}$.

6. The memory according to claim 1, wherein
in the case the element α is the Tc, Re, Ru, Os, Rh, Ir, Pd, Pt, Co, or Ni in the first group, the element α has an area density in the oxide dielectric film expressed as [MH],
the element β has an area density in the oxide dielectric film expressed as [A], and
the valence difference in the second group is expressed as K, K=1 in nitrogen, K=2 in carbon, K=3 in boron, K=2 in Mg, Ca, Sr and Ba, K=1 in Al, Sc, Y, La and Lantanoide, then the [MH], [A] and K are belonging to a first range of
$0\leq\{K\times[A]\}/[MH]\leq1$, and
$1.0\times10^{12}$ cm$^{-2}$-$1.3\times10^{11}$ cm$^{-2}\times\{K\times[A]\}/[MH]\leq[MH]\leq2.0\times10^{14}$ cm$^{-2}$+$0.8\times10^{14}$ cm$^{-2}\times\{K\times[A]\}/[MH]$, or belonging to a second range of
$1\leq\{K\times[A]\}/[MH]\leq6$, and
$1.0\times10^{12}$ cm$^{-2}$-$1.3\times10^{11}$ cm$^{-2}\times\{K\times[A]\}/[MH]\leq[MH]\leq2.0\times10^{14}$ cm$^{-2}$.

7. The memory according to claim 1, wherein in the case the element α is the Tc, Re, Ru, Os, Rh, Ir, Pd, Pt, Co, or Ni in the first group,
the element α has an area density in the oxide dielectric film expressed as [MH],
the element β has an area density in the oxide dielectric film expressed as [A], and
the valence difference in the second group is expressed as K, K=1 in nitrogen, K=2 in carbon, K=3 in boron, K=2 in Mg, Ca, Sr and Ba, K=1 in Al, Sc, Y, La, and Lantanoide, then the [MH], [A] and K are belonging to a third range of
$0\leq\{K\times[A]\}/[MH]\leq3$, and
$5.0\times10^{12}$ cm$^{-2}$-$6.7\times10^{11}$ cm$^{-2}\times\{K\times[A]\}/[MH]\leq[MH]\leq0.7\times10^{14}$ cm$^{-2}$+$0.7\times10^{14}$ cm$^{-2}\times\{K\times[A]\}/[MH]$, or belonging to a fourth range of $3\leq\{K\times[A]\}/[MH]\leq6$, and
$5.0\times10^{12}$ cm$^{-2}$-$6.7\times10^{11}$ cm$^{-2}\times\{K\times[A]\}/[MH]\leq[MH]\leq2.8\times10^{14}$ cm$^{-2}$.

8. The memory according to claim 1, wherein the element α is the Ru, Os, Rh or Ir in the first group, and the element α is substituted for the Ti, Zr or Hf in the oxide dielectric film.

9. The memory according to claim 1, wherein
in the case the element α is the W, Mo, Cr, Mn or Fe in the first group, the element α has an area density in the oxide dielectric film expressed as [MH],
the element β has an area density in the oxide dielectric film expressed as [A], and
the valence difference in the second group is expressed as K, K=1 in nitrogen, K=2 in carbon, K=3 in boron, K=2 in Mg, Ca, Sr and Ba, K=1 in Al, Sc, Y, La and Lantanoide, then the [MH], [A] and K are belonging to a fifth range of
$0\leq\{K\times[A]\}/[MH]\leq1$ and
$1.0\times10^{12}$ cm$^{-2}$-$1.3\times10^{11}$ cm$^{-2}\times\{K\times[A]\}/[MH]\leq[MH]\leq1.0\times10^{14}$ cm$^{-2}$+$1.0\times10^{14}$ cm$^{-2}\times\{K\times[A]\}/[MH]$, or
belonging to a sixth range of
$1\leq\{K\times[A]\}/[MH]\leq6$, and
$1.0\times10^{12}$ cm$^{-2}$-$1.3\times10^{11}$ cm$^{-2}\times\{K\times[A]\}/[MH]\leq[MH]\leq2.0\times10^{14}$ cm$^{-2}$.

10. The memory according to claim 1, wherein
in the case the element α is the W, Mo, Cr, Mn or Fe in the first group, the element α has an area density in the oxide dielectric film expressed as [MH],
the element β has an area density in the oxide dielectric film expressed as [A], and
the valence difference in the second group is expressed as K, K=1 in nitrogen, K=2 in carbon, K=3 in boron, K=2 in Mg, Ca, Sr and Ba, K=1 in Al, Sc, Y, La and Lantanoide, then the [MH], [A] and K are belonging to a seventh range of
$0\leq\{K\times[A]\}/[MH]\leq2$, and
$5.0\times10^{12}$ cm$^{-2}$-$6.7\times10^{11}$ cm$^{-2}\times\{K\times[A]\}/[MH]\leq[MH]\leq0.7\times10^{14}$ cm$^{-2}$+$6.5\times10^{13}$ cm$^{-2}\times\{K\times[A]\}/[MH]$, or belonging to an eighth range of
$2 \leq \{K \times [A]\}/[MH] \leq 6$, and
$5.0 \times 10^{12}$ cm$^{-2}$-$6.7 \times 10^{11}$ cm$^{-2} \times \{K \times [A]\}/[MH] \leq [MH] \leq 2.0 \times 10^{14}$ cm$^{-2}$.

11. The memory according to claim 1, wherein the element α is substituted for the Ti Zr or Hf in the oxide dielectric film, the whole amount of the element α is [A], the whole amount of the element β is [B], the valence difference in the second group is expressed as K, K=1 in nitrogen, K=2 in carbon, K=3 in boron, K=2 in Mg, Ca, Sr and Ba, K=1 in Al, Sc, Y, La, and Lantanoide, and the valence difference in the first group is expressed as L, L=2 in Cr, Mo and W, L=3 in Mn, Tc and Re, L=4 in Fe, Ru and Os, L=5 in Co, Rh and Ir, and L=6 in Ni, Pd and Pt, then, the [A], [B], K, and L belong to a range of $0 \leq \{K \times [B]\}/\{L \times [A]\} \leq 1.0$.

12. The memory according to claim 1, wherein the oxide dielectric film is a single-layer film formed of any one of TiO$_2$, SrTiO$_3$, and (Ba, Sr, Ca) TiO$_3$, or a multi-layer film formed of the single-layer film.

13. The memory according to claim 1, wherein the oxide dielectric film is a single-layer film formed of any one of ZrO$_2$, SrZrO$_3$, (Ba, Sr, Ca) ZrO$_3$, La$_2$Zr$_2$O$_7$, HfO$_2$, SrHfO$_3$, (Ba, Sr, Ca) HfO$_3$, and La$_2$Hf$_2$O$_7$, or a multi-layer film formed of the single-layer film.

14. The memory according to claim 1, wherein the first insulating layer is a single-layer film of any one of silicon oxide film, silicon oxynitride film, and silicon nitride film, or a multi-layer film formed of the single-layer film.

15. The memory according to claim 1, wherein the first insulating layer includes silicon, oxygen or nitrogen, and is formed of at least one of a multi-layer film forming a single quantum well or a multiple quantum well, and a film dispersing the silicon for forming a single quantum dot or multiple quantum dots.

16. The memory according to claim 15, wherein a quantum level is mutually different in the quantum well or quantum dot adjacent to each other in a film thickness direction.

17. The memory according to claim 1, wherein the second insulating layer is a single-layer film formed of any one of LaAlO$_3$, Al$_2$O$_3$, AlN, AlNO, ZrO$_2$, SrZrO$_3$, (Ba, Sr, Ca) ZrO$_3$, La$_2$Zr$_2$O$_7$, HfO$_2$, SrHfO$_3$, (Ba, Sr, Ca) HfO$_3$, and La$_2$Hf$_2$O$_7$, or a multi-layer film formed of the single-layer film.

18. The memory according to claim 1, wherein the second insulating layer further includes a region inclined to metal-rich side from stoichiometry in the range of area density from $2.5 \times 10^{1012}$/cm$^2$ to $1 \times 10^{14}$/cm$^2$.

19. The memory according to claim 1, wherein the second insulating layer further includes a region inclined to metal-poor side from stoichiometry in the range of area density from $2.5 \times 10^{12}$/cm$^2$ to $1 \times 10^{14}$/cm$^2$.

20. A method of manufacturing a nonvolatile semiconductor memory comprising:

forming a source region and a drain region across an interval on a semiconductor substrate, and forming a channel region in the interval;

forming a first insulating layer on the channel region;

forming a charge accumulating layer on the first insulating layer, the charge accumulating layer having a Ti oxide dielectric film, a Zr oxide dielectric film or a Hf oxide dielectric film, the oxide dielectric film containing an element α selected from a first group consisting of Tc, Re, Ru, Os, Rh, Ir, Pd, Pt, Co, Ni, W, Mo, Cr, Mn and Fe, and an element β selected from a second group consisting of nitrogen, carbon, boron, Mg, Ca, Sr, Ba, Al, Sc, Y, La and Lantanoide, the element α and the element β being distributed in the oxide dielectric film;

forming a second insulating layer on the charge accumulating layer; and forming a control gate electrode on the second insulating layer.

* * * * *